United States Patent
Kim et al.

(10) Patent No.: US 11,237,983 B2
(45) Date of Patent: *Feb. 1, 2022

(54) MEMORY DEVICE, METHOD OF OPERATING MEMORY DEVICE, AND COMPUTER SYSTEM INCLUDING MEMORY DEVICE

(71) Applicant: SAMSUNG ELECTRONICS CO., LTD., Suwon-si (KR)

(72) Inventors: Taehyo Kim, Daegu (KR); Daeseok Byeon, Seongnam-si (KR); Taehong Kwon, Seoul (KR); Chanho Kim, Seoul (KR); Taeyun Lee, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/865,580

(22) Filed: May 4, 2020

(65) Prior Publication Data

US 2021/0124693 A1    Apr. 29, 2021

(30) Foreign Application Priority Data

Oct. 28, 2019  (KR) .................. 10-2019-0134681

(51) Int. Cl.
| | | |
|---|---|---|
| *G06F 12/02* | (2006.01) | |
| *G06F 12/123* | (2016.01) | |
| *G11C 11/4091* | (2006.01) | |
| *G11C 11/408* | (2006.01) | |
| *G11C 11/4094* | (2006.01) | |
| *G06F 12/14* | (2006.01) | |

(52) U.S. Cl.
CPC ........ *G06F 12/123* (2013.01); *G06F 12/0246* (2013.01); *G06F 12/1441* (2013.01); *G11C 11/4085* (2013.01); *G11C 11/4091* (2013.01); *G11C 11/4094* (2013.01)

(58) Field of Classification Search
CPC .............................................. G06F 2212/1016
USPC ......................................................... 711/154
See application file for complete search history.

(56) References Cited

U.S. PATENT DOCUMENTS

| | | | |
|---|---|---|---|
| 8,060,719 B2 | 11/2011 | Radke et al. | |
| 8,078,794 B2* | 12/2011 | Lee ..................... | G06F 12/0246 |
| | | | 711/103 |
| 8,230,184 B2 | 7/2012 | Danilak | |
| 8,675,415 B2 | 3/2014 | Kim et al. | |

(Continued)

OTHER PUBLICATIONS

U.S. Office Action dated Jun. 18, 2021 Cited in Related U.S. Appl. No. 17/007,501.

*Primary Examiner* — Min Huang
(74) *Attorney, Agent, or Firm* — Volentine, Whitt & Francos, PLLC

(57) ABSTRACT

A memory device includes; a memory area including a first memory area including first memory cells storing N-bit data and a second memory area including second memory cells storing M-bit data, where 'M' and 'N' are natural numbers and M is greater than N, and a controller configured to read data stored in the first memory area using a first read operation, read data stored in the second memory area using a second read operation different from the first read operation, and selectively store data in one of the first memory area and the second memory area based on a frequency of use (FOU) of the data.

17 Claims, 17 Drawing Sheets

(56) References Cited

U.S. PATENT DOCUMENTS

| | | | |
|---|---|---|---|
| RE46,994 E * | 8/2018 | Kim | G11C 16/3418 |
| 10,140,067 B1 | 11/2018 | Horn et al. | |
| 2009/0300269 A1 | 12/2009 | Radke et al. | |
| 2010/0191922 A1 | 7/2010 | Dickey et al. | |
| 2011/0161681 A1* | 6/2011 | Dhuse | G06F 11/1443 |
| | | | 713/193 |
| 2015/0058553 A1* | 2/2015 | Wu | G06F 12/0888 |
| | | | 711/113 |
| 2015/0363105 A1* | 12/2015 | Nakao | G06F 12/0246 |
| | | | 711/103 |
| 2017/0047124 A1* | 2/2017 | Ellis | G06F 3/0688 |
| 2018/0211708 A1* | 7/2018 | Igahara | G06F 3/0679 |
| 2018/0373437 A1 | 12/2018 | Navon et al. | |
| 2019/0371406 A1 | 12/2019 | Yang et al. | |
| 2020/0020365 A1 | 1/2020 | Takizawa | |
| 2020/0350287 A1 | 11/2020 | Liu | |
| 2020/0379861 A1* | 12/2020 | Park | G06F 11/076 |
| 2020/0388342 A1* | 12/2020 | Yang | G11C 16/08 |
| 2021/0124693 A1 | 4/2021 | Kim et al. | |

\* cited by examiner

MEMORY DEVICE, METHOD OF OPERATING MEMORY DEVICE, AND COMPUTER SYSTEM INCLUDING MEMORY DEVICE

CROSS-REFERENCE TO RELATED APPLICATION(S)

This application claims priority to Korean Patent Application No. 10-2019-0134681 filed on Oct. 28, 2019 in the Korean Intellectual Property Office, the subject matter of which is hereby incorporated by reference.

BACKGROUND

Exemplary embodiments of the inventive concept relate generally to memory device(s) and computer system(s) including same.

A memory device includes a plurality of memory cells. Data may be written to, read from, or erase from one or more of the memory cells during one or more data access operation(s) (e.g., a write (or program) operation, a read operation, and an erase operation). Typically, a fixed number of data bit(s), data byte(s), data page(s), data plane(s), or data block(s) is the subject of a data access operation.

Neuromorphic computer systems (e.g., computer systems used in autonomous driving vehicles) have adopted various methods of distributing, storing and accessing various data according to is frequency of use (e.g., the number of times the data is accessed over a defined period of time). When memory cells are programmed using a method that fails to take into consideration the frequency of use for the data being programmed, the overall reliability and/or operating efficiency of the memory device may be degraded.

SUMMARY

Embodiments of the inventive concept provide memory devices in which data may be distributed across, selectively stored in, and read from multiple memory areas using different data access operations. Data may be stored in this manner depending on the frequency of use of the data in order to efficiently manage storage space and to improve data reliability.

According to one embodiment, a memory device includes; a memory area including a first memory area including first memory cells storing N-bit data and a second memory area including second memory cells storing M-bit data, where 'M' and 'N' are natural numbers and M is greater than N, and a controller configured to read data stored in the first memory area using a first read operation, read data stored in the second memory area using a second read operation different from the first read operation, and selectively store data in one of the first memory area and the second memory area based on a frequency of use (FOU) of the data.

According to another embodiment, a memory device includes; a memory area including a first memory area including first memory cells operated as single-level memory cells (SLC), another memory area including memory cells operated as multi-level memory cells (MLC), and a security area, and a controller configured to read data stored in the first memory area using a first read operation, read data stored in the another memory area using a second read operation different from the first read operation, selectively store data in one of the first memory area and the another memory area based on a frequency of use (FOU) of the data and an importance weighting of the data, and store data having a low FOU and a high importance weighting in the security area.

According to another embodiment, a computer system includes; a processor configured to control execution of a first operation at a first speed, control execution of a second operation at a second speed different from the first speed, and provide data to a memory device, wherein the memory device includes a memory area including a first memory area including memory cells storing N-bit data and a second memory area including memory cells storing M-bit data, where 'M' and 'N' are natural numbers and M is greater than N and a controller. The controller may be configured to read data stored in the first memory area using a first read operation in response to execution of the first operation, read data stored in the second memory area using a second read operation different from the first read operation in response to execution of the second operation, and store the data provided by the processor in one of the first memory area and the second memory area based on a frequency of use (FOU) of the data.

According to another embodiment, a method of operating a memory device including a memory area is provided, where the memory area includes a first memory area including memory cells storing N-bit data and a second memory area including memory cells storing M-bit data, where and 'N' are natural numbers and M is greater than N. The method includes; reading data stored in the first memory area using a first read operation, reading data stored in the second memory area using a second read operation different from the first read operation, and storing data in one of the first memory area and the second memory area based on a frequency of use (FOU) of the data.

BRIEF DESCRIPTION OF DRAWINGS

The above and other aspects, features, and advantages of the inventive concept will be clearly understood upon consideration of the following detailed description, taken in conjunction with the accompanying drawings.

DETAILED DESCRIPTION

Hereinafter, embodiments of the inventive concept will be described in some additional detail with reference to the accompanying drawings.

Figure 1:
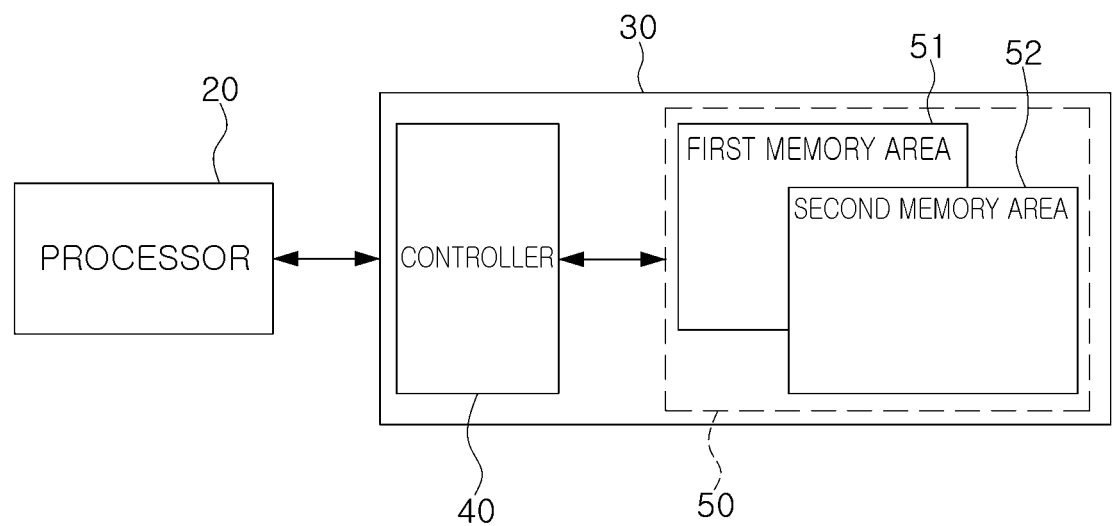
FIG. 1 is a block diagram illustrating a computer system according to an embodiment of the inventive concept.

Figure (FIG. 1 is a block diagram of a computer system 10 according to an embodiment of the inventive concept.

Referring to FIG. 1, the computer system 10 may generally include a processor 20 and a memory device 30. The processor 20 controls the overall operation of the computer system 10 and may be implemented as an application processor, a central processing unit, etc. In certain embodiments of the inventive concept, the computer system 10 may be a neuromorphic computer system—that is, a computational system mimicking the nature, configuration and/or operating characteristics of neurons in a nervous system of a living organism. Thus, the processor 20 may include a neuromorphic model which mimics neurons in a neural network.

In the illustrated example of FIG. 1, the memory device 30 includes a controller 40 and a memory area 50, where the memory area 50 is divided (conceptually and/or physically) into at least a first memory area 51 and a second memory area 52. The memory area 50 may also include one or more "another memory area" besides the first memory area 51 and the second memory are 52. Each of the first memory area 51 and the second memory area 52 includes a plurality of memory cells, where the first memory area 51 may include a different number, arrangement and/or type of memory cells than the second memory area 52. Here, the first memory cells of the first memory area 51 and the second memory cells of the second memory area 52 may be arranged in different memory planes, different memory blocks, and/or different arrangements defined by word line connections, for example.

The controller 40 may "access" (e.g., write, program, read and erase) data in the first memory area 51 using a first set of data access operations and access the second memory area 52 using a second set of data access operations, different from the first set of data access operations. For example, in certain embodiments of the inventive concept, the controller 40 may access N bits of data in relation to the memory cells included in the first memory area 51, and access M bits of data in relation to the memory cells included in the second memory area 52, where 'M' and 'N' are positive integers and M may be greater than N. Thus, a first program operation from the first set of data access operations may be used to store N bits of data per memory cell in the first memory area 51, and a second program operation from the second set of data access operations may be used to store M buts of data per memory cell in the second memory area 52.

In this regard, the controller 40 may dynamically choose to store data in either the first memory area 51 or the second memory area 52 depending on the frequency of use of the data. For example, the controller 40 may store data having a relatively high frequency of use (hereafter, "high frequency data") in the first memory area 51 and data having a relatively low frequency of use (hereafter, "low frequency data") in the second memory area 52. In various embodiments of the inventive concept, the controller 40 may determine or define a "frequency of use" (hereafter, "FOU") for data using one or more techniques, such as (e.g.,) retention time, elapsed time since the data was stored at a specific address, counter information, where a counter may be incremented each time the data is accessed according to one or more data access operations, etc.

The controller 40 may determine to store data in either the first memory area 51 or the second memory area 52 by comparing a current FOU for the data with a predetermined FOU reference value. Thus, data having a relatively low FOU may be stored in the second memory area 52, while data having a relatively high FOU may be stored in the first memory area 51. The conceptual and/or physical distinction between the first memory area 51 and the second memory area 52 may be made by the controller 40 and/or the processor 20 according to such factors as memory cell characteristic(s), different address location(s), defined rotation, random selection, etc.

In addition, the controller 40 may read data stored in the first memory area 51 using a first read operation of the first set of data access operations, and may read data stored in the second memory area 52 using a second read operation of the second set of data access operations, where the first read operation and the second read operation may be different from one another. For example, in certain embodiments of the inventive concept, the first read operation may be a voltage sensing operation, and the second read operation may be a current sensing operation. It follows from this particular example that the first read operation and the second read operation may have different operating speeds and/or different data reading accuracies. That is, a relatively slower and more accurate data reading operation may be used to read one type of data stored in one memory area, while a relatively faster yet less accurate data reading operation may be used to read another type of data stored in a different memory area. Accordingly, data distinguished by its FOU may be read data using a read operation that is most appropriate in speed and accuracy to that data. In certain embodiments of the inventive concept, such read optimized data may be provided to the processor 20 including a neuromorphic circuit and associated data processing operations designed to receive data at different speeds and with different read accuracies.

As an example, the processor 20 may be designed to execute a first operation at a first data processing speed and execute a second operation at second data processing speed lower than the first data processing speed. Accordingly, the memory device 30 may access data from the first memory area 51 using one or more operations selected from the first set of data access operations, and access data from the second memory area 52 using one or more operations selected from the second set of data access operations. Thus, the memory device 30 may read data from the first memory area 51 at a relatively high speed and transmit the read data to the processor 20 in a manner consistent with the requirements (or expectations) of the first operation. Yet, the memory device 30 may also read data from the second memory area 52 at a relatively low speed in a manner consistent with the requirements (or expectations) of the second operation. As a result, different data may be variously and efficiently read, as needed, using a high speed data read operation or a low speed data read operation, depending on the nature of the data being read (e.g., its FOU) and accordingly, its stored location in memory. This approach allows better conservation of overall memory space and power consumption.

Figure 2:
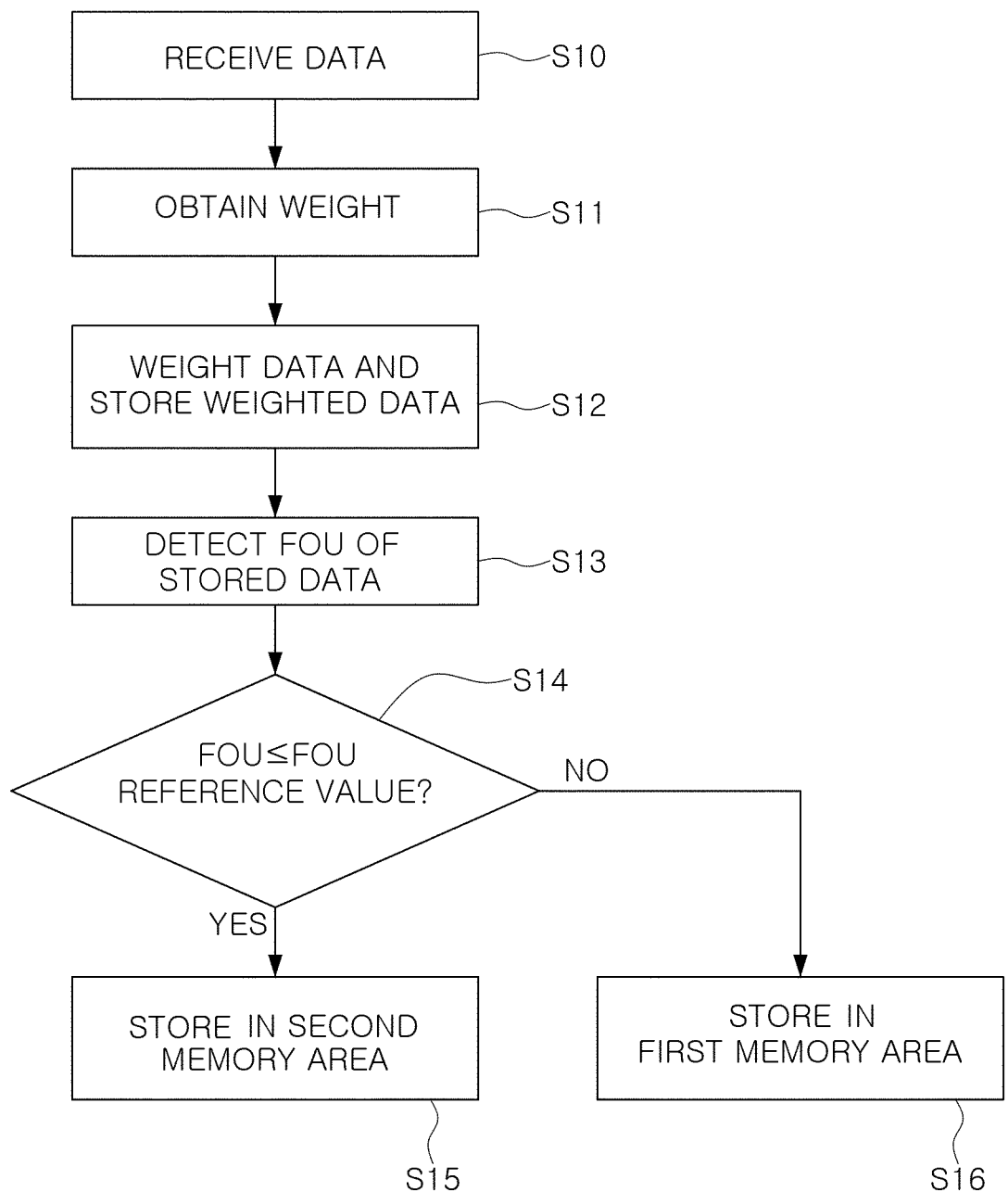
FIG. 2 is a flowchart summarizing in one example a method of operating a memory device according to an embodiment of the inventive concept.

FIG. 2 is a flowchart illustrating in one example a method of operating a memory device according to an embodiment of the inventive concept. Hereinafter, for ease of description, operation of the memory device 30 shown in FIG. 1 will be described with reference to FIG. 2.

Referring to FIG. 2, the operating method begins when data is received by the memory device 30 (S10). Here, the memory device 30 may receive data from various external devices such as the processor 20, a sensor, a communication module, etc.

Upon receiving the data in the memory device 30, a weight for the data may be obtained (S11). For example, a number of weights may be stored in the first memory area 51. Each weight may be a value assignable to data to indicate an importance of the data (e.g.,) in a neuromorphic computer system. In this regard each weight may be considered an "importance weighting."

Once an appropriate weight has been selected, the controller 40 included in the memory device 30 may be used to weight the data in order to generate corresponding weighted data, and the weighted data may be stored (S12). In certain embodiments, the controller 40 may include an artificial intelligence (AI) operation module capable of executing one or more operation(s) that effectively weight data. Here, data weighting may take into account a FOU for the data or for similar data in the neuromorphic computer system. Data weighted according to a high FOU may be stored in the first memory area 51, and data weighted according to a low FOU may be stored in the second memory area 52.

Once data has been stored in the memory area 50, the memory device 30 may periodically detect (check, or update) the FOU of the stored data (S13) to essentially determine a current FOU for the stored data. As an example, the memory device 30 may periodically detect the FOU of stored data as part of one or more housing keeping operation(s). Alternately or additionally, the memory device 30 may detect the FOU of stored data when the size of available storage space in the first memory area 51 (or the second memory area 52) falls below a critical threshold.

The memory device 30 may compare the current FOU of the stored data with the FOU reference value. If the current FOU of the stored data is less than or equal to the FOU reference value (S14=YES), the data is stored in the second memory area 52 (S15), else if the current FOU of the stored data is not less than or equal to the FOU reference value (S14=NO), the data is stored in the first memory area 51 (S16).

In this manner, the memory device 30 may appropriately sort stored data between the first memory area 51 and the second memory area 52 according to a current FOU of the stored data, recognizing that the FOU of the stored data may change over time and/or with continued use of the memory device 30. Alternately or additionally, the memory device may move (or allocate) stored data between the first memory area 51 and the second memory area 52 using various FOU thresholds, respective and/or available memory area capacities, data use demands, power levels, etc.

Figure 3:
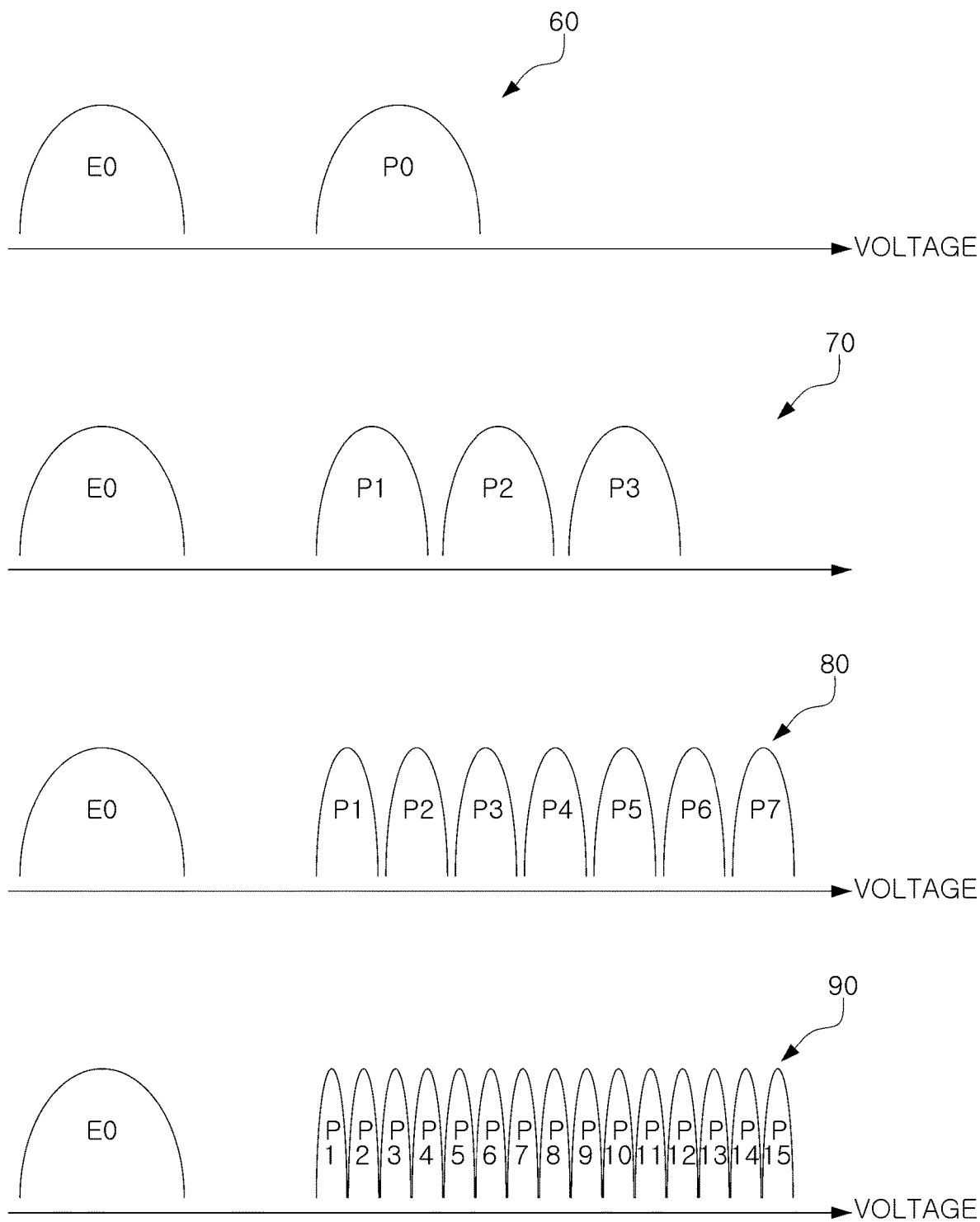
FIG. 3 is a conceptual diagram illustrating threshold voltage distributions for memory cell of a memory device according to an embodiment of the inventive concept.

FIG. 3 illustrates the operation of a memory device according to an embodiments of the inventive concept.

FIG. 3 compares threshold voltage distributions 60, 70, 80 and 90 and illustrates various operations associated with first, second, third and fourth memory regions of a memory device. In FIG. 3, it is assumed that memory cells provided by the memory device have been divided into the first, second, third and fourth memory areas, and that first memory cells of the first memory area, second memory cells of the second memory area, third memory cells of the third memory area, and fourth memory cells of the fourth memory area are differently accessed according to a different number of data stored per memory cell.

The first, second, third and fourth memory regions may be included in (e.g., commonly fabricated on) a single memory device implemented as a single (or unitary) semiconductor chip. The division (or definition) of the first, second, third and fourth memory areas may be provided according to memory plane(s), memory block(s), wordline(s), etc.

Each of the first memory cells of the first memory area may be used to store a single data bit per memory cell and may be referred to a Single Level memory Cells (SLC). Stated in other terms, the first memory cells may be "operated as" SLC. Hence, data may be stored in each of the first memory cells according to an erased state E0 and a programmed state P0, where erased state E0 indicates a threshold voltage distribution for unprogrammed memory cells, and the programmed state P0 indicates a threshold voltage distribution for programmed memory cells.

Each of the second memory cells of the second memory area may be used to store two (2) bit data according to an erased state E0 and first, second and third programmed states P1, P2 and P3.

Each of the third memory cells of the third memory area may be used to store three (3) bit data according to an erased state E0 and first through seventh programmed states P1 to P7, and each of the fourth memory cells of the fourth memory area may be used to store four (4) bit data according to an erased state E0 and first through fifteenth programmed states P1 to P15.

The second, third and fourth memory cells described in relation to FIG. 3 are examples of Multi-Level memory Cells (MLC). Alternately stated, the second, third and fourth memory cells may be operated as MLC.

Assuming a memory device consistent with FIG. 3, the first memory cells of the first memory area provide a much greater sensing margin than the second, third and fourth memory cells of the second, third and fourth memory areas. Therefore, data stored in the first memory cells of the first memory area may be read using one or more voltage sensing operation(s) having relatively low accuracy but offering high reading speed. Whereas the second memory cells, the third memory cells, and the fourth memory cells of the second, third and fourth memory regions provide successively lower sensing margins. Therefore, data stored in the second, third and fourth memory areas may be read using one or more current sensing operation(s) having low reading speed but offering high reading accuracy.

In certain embodiments of the inventive concept, a memory device consistent with FIG. 3 may store data having a highest range of FOUs in the first (SLC) memory area 60, a first lower range of FOUs in the second memory area 70, a second lower range of FOUs in the third memory area 80 and, a lowest range of FOUs in the fourth memory area 90.

In this regard, at least a portion of the MLC provided by the third memory area 80 and/or the fourth memory area 90 may be designated as residing in (or occupying) a security area. MLC in the security area are deemed to be functionally "not-erase" memory cells, where not-erase memory cells are not allowed to be erased by normally occurring operations, such as the erase operation or a variety of house-keeping operations. That is, only particular data access operations having an elevated level of authority may be used to erase (or reallocate) not-erase memory cells.

In this manner, a memory device according to embodiments of the inventive concept may store certain data having a very low FOU in the security area (hereafter, "security data"), where such security data may be retained over long periods of time without being erased. Alternately or additionally, certain data having very high importance weighting among data having a relatively low FOU may be stored in the security area. However the security data is defined, any attempt to erase or overwrite security data in the memory device may result in a system warning to a user, for example, or some other non-routine memory device response designed to ensure preservation of the security data.

Figure 4:
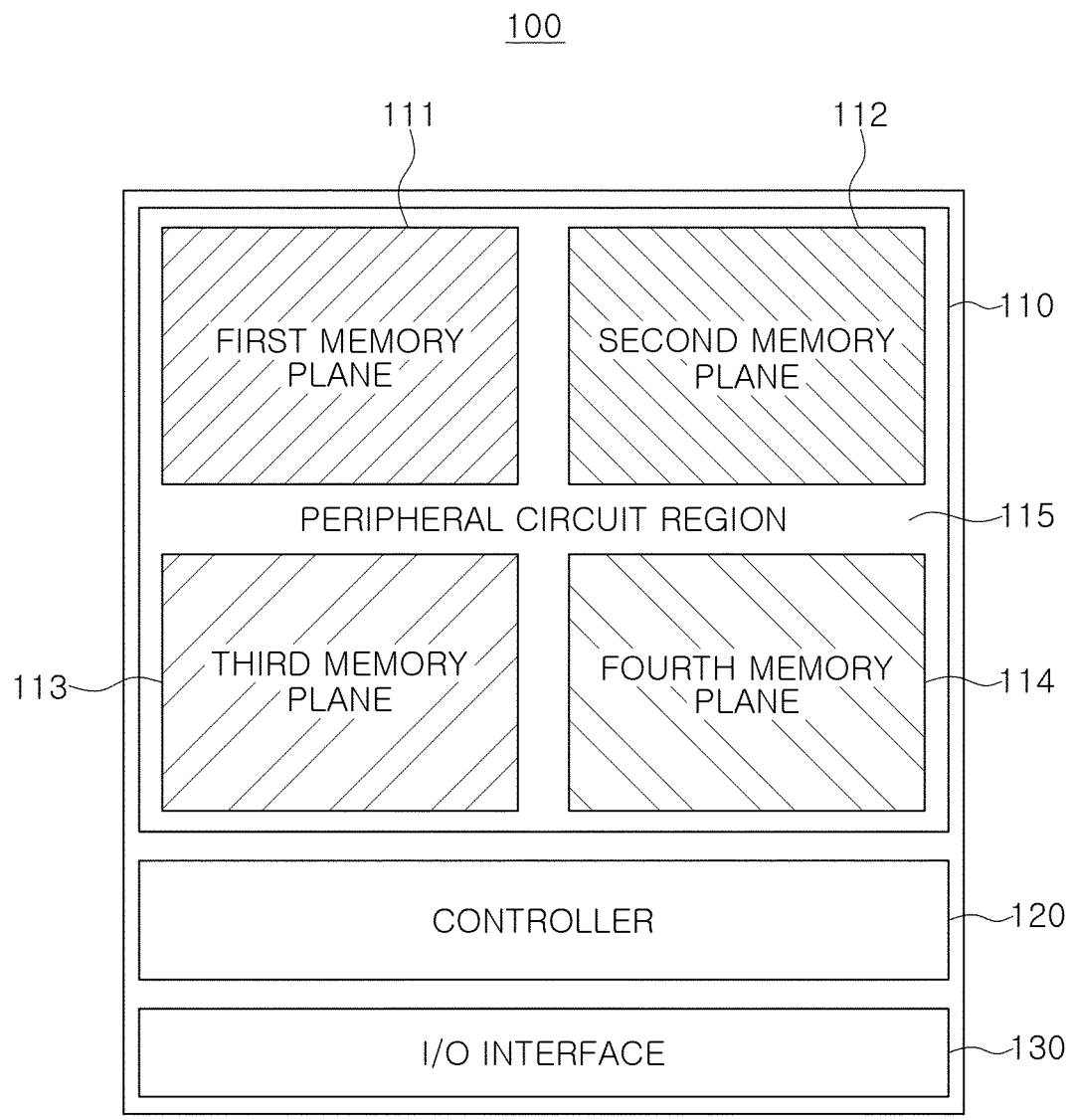
FIGS. 4, 5 and 6 are block diagram respectively illustrating possible configurations for a memory device according to embodiments of the inventive concepts.
Figure 5:
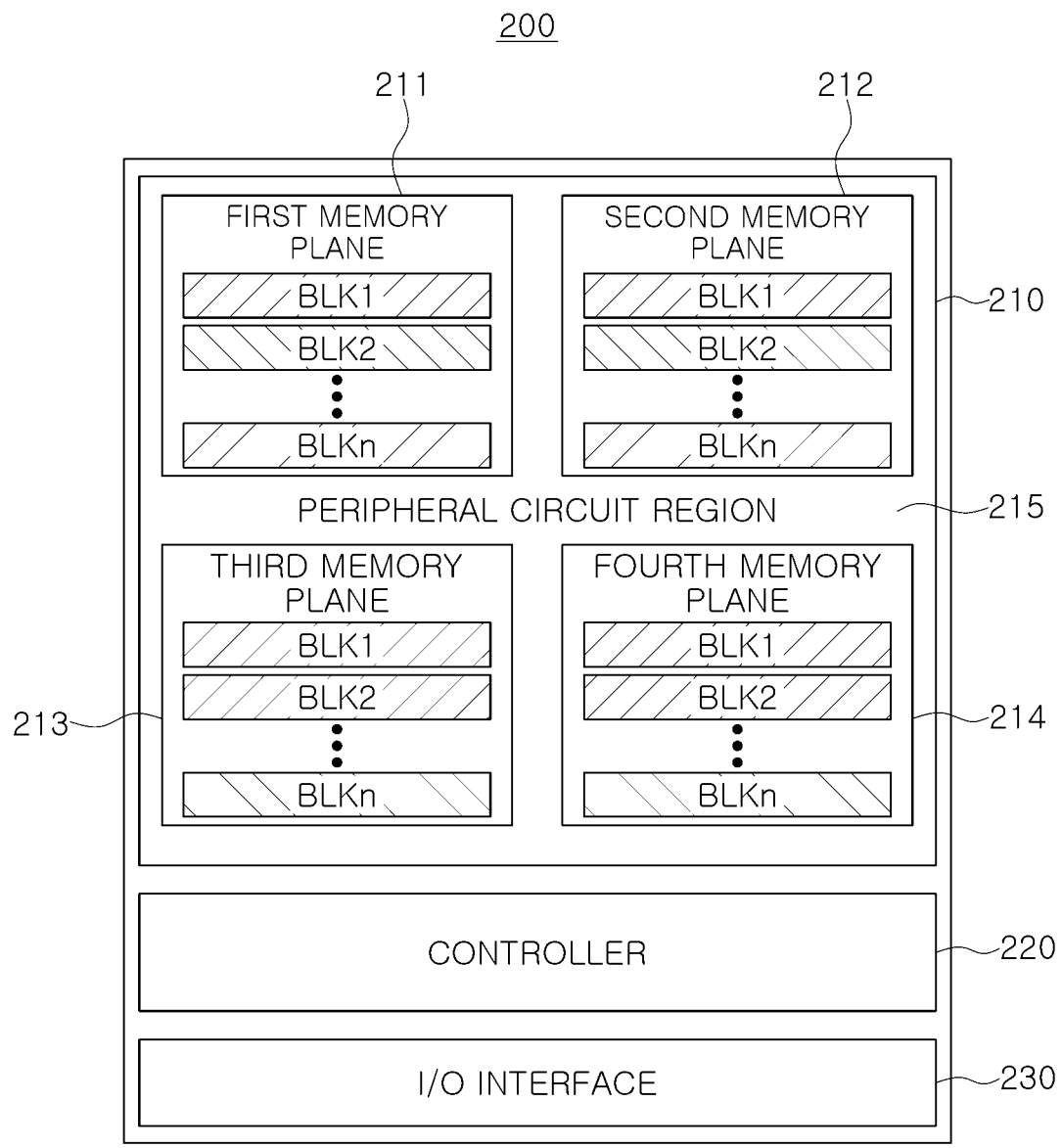
Figure 6:
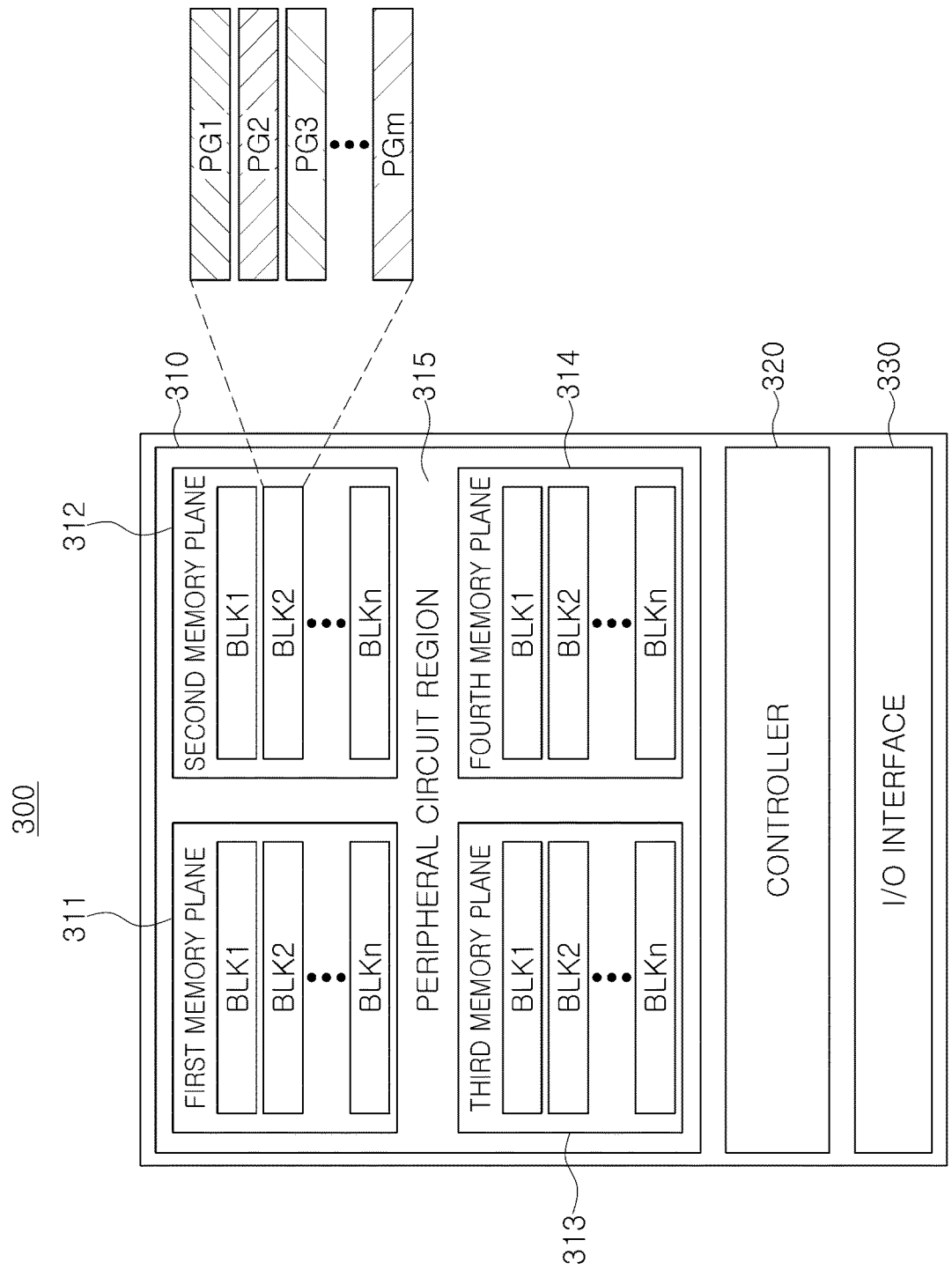

FIGS. 4, 5 and 6 are conceptual diagrams illustrating in various examples certain memory device and methods of operating same according embodiments of the inventive concept.

Referring to FIGS. 4, 5 and 6, memory devices 100, 200, and 300 respectively include memory areas 110, 210, and 310, controllers 120, 220, and 320, input/output interfaces (I/O interfaces) 130, 230, and 330. Each of the memory regions 110, 210, and 310 may include a plurality of memory planes 111, 112, 113 and 114 (hereafter, inclusively indicated as "111-114"), 211-214, and 311-314, and peripheral circuit regions 115, 215, and 315. Each of the memory planes 111-114, 211-214, and 311-314 may include memory cells. In the illustrated embodiments, the peripheral circuit regions 115, 215, and 315 may be disposed below the memory cells. In this context, the term "below" (like such terms as "above", "beside", "higher", "lower", etc.) denotes a geometric relationship between elements that assumes an arbitrary set of directions or coordinates. Those skilled in the art will understand that such relative geometric relationships may be drawn from the accompanying drawings to further describe certain embodiments of the inventive concept. The inventive concept is, however, not limited to only the illustrated relationships.

The controller 120, 220, and 320 may be used to control the memory areas 110, 210, and 310 during the execution of various data access operations, and during the exchange of data between an external device through the I/O interfaces 130, 230, and 330, respectively. In addition, the controllers 120, 220, and 320 may be used to execute a data weighting operation for data to be stored in the memory areas 110, 210, and 310. In this regard, possible weights assignable to various data may be stored in the first memory planes 111, 211, and 311.

In the embodiment illustrated in FIG. 4, each of the memory planes 111-114 may be used to store data in a respectively different manner. For example, first memory cells of the first memory plane 111 may be used as SLC, second memory cells of the second memory plane 112 may be used as 2-bit MLC, third memory cells of the third memory plane 113 may be used as 3-bit MLC, and fourth memory cells of the fourth memory plane 114 may be used as 4-bit MLC.

The controller 120 may be used to detect FOU of data stored in the memory planes 111-114 in order to sort the stored data (e.g., by transferring and re-storing the stored data according to a detected, current FOU) among the memory planes 111-114 depending on the frequency of use. As an example, the controller 120 may transfer and store data in the first memory plane 111 when the stored data FOU is greater than a first FOU reference value. The controller 120 may transfer and store data in the second memory plane 112 when the stored data FOU is less than or equal to the first FOU reference value but greater than a second FOU reference value. The controller 120 may transfer and store data in the third memory plane 113 when the stored data FOU is less than or equal to the second FOU reference value but greater than a third FOU reference value, the controller 120 may transfer and store data in the fourth memory plane 114 when the stored data FOU is less than or equal to the third FOU reference value. That is, three different FOU reference values may be used to appropriately sort stored data according to current FOU into one of the memory planes 111-114.

With data stored across multiple memory planes in this manner, the controller 120 may perform different read operations to memory cells respectively disposed in at least a portion of the memory planes 111-114. For example, the controller 120 may read data stored in the first memory plane 111 using a voltage sensing operation, yet read data stored in the second, third and fourth memory planes 112, 113 and 114 using one or more current sensing operation(s).

In the embodiment illustrated in FIG. 5, the respective memory planes 211-214 are further divided into first through nth memory blocks BLK1 to BLKn. Here, each memory cell in the respective first memory blocks BLK1 may be used as SLC, each memory cell in the respective second memory blocks BLK2 through Nth memory blocks BLKn may be variously used as n-bit MLC, where in a positive integer greater than 1. Here, for example, the memory cells of the respective second memory blocks BLK2 and the memory cells of the respective third memory blocks BLK3 may be used as 2-bit MLC. Alternately, the memory cells of the respective second memory blocks BLK2 may be used as 2-bit MLC, the memory cells of the respective third memory blocks BLK3 may be used as 3-bit MLC, and the memory cells of the respective fourth memory blocks BLK4 may be used as 4-bit MLC. Alternately, some of the memory cells in designated portions of the respective second memory blocks BLK2 may be used as 2-bit MLC, and some of the memory cells in designated portions of the respective third memory blocks BLK3 may be used as 2-bit MLC. Thus, in the illustrated example of FIG. 5, the number of data bits that may be stored in the memory cells of respective memory blocks BLK1 to BLKn in subject to design choice.

The controller 220 may be used to organize various memory blocks BLK1 to BLKn into a single read-unit (or a single write-unit) that may receive a selected read method (or write method), like the ones described above. And as before, the allocation of data among the various memory planes 211-214 and various memory blocks BLK1 to BLKn may be made in accordance with stored data FOU and associated FOU reference values.

In the embodiment illustrated in FIG. 6, each of the memory blocks BLK1 to BLKn in each of the memory planes 311-314 may be further divided into first through m-th pages PG1 to PGm, where respective pages PG1 to PGm may store be used to access data differently. For example, memory cells of the first page PG1 may be used as SLC data, memory cells of the second page PG2 may be used as 2-bit MLC, memory cells of the third page PG3 may be used as 3-bit MLC, and memory cells of the m-th page PGm may be used as store 4-bit MLC.

Here, the pages PG1 to PGm may be defined in relation to connected wordlines included in each of the memory blocks BLK1 to BLKn. In the embodiment illustrated in FIG. 6, the number of bits of data stored in memory cells may vary depending on the pages PG1 to PGm. Accordingly, the controller 320 may define each of the pages PG1 to PGm as a single unit area to apply a reading method. Also, the controller 320 may define each of the memory pages PG1 to PGm as a single unit to determine an area in which data is to be stored, according to a FOU.

Figure 7:
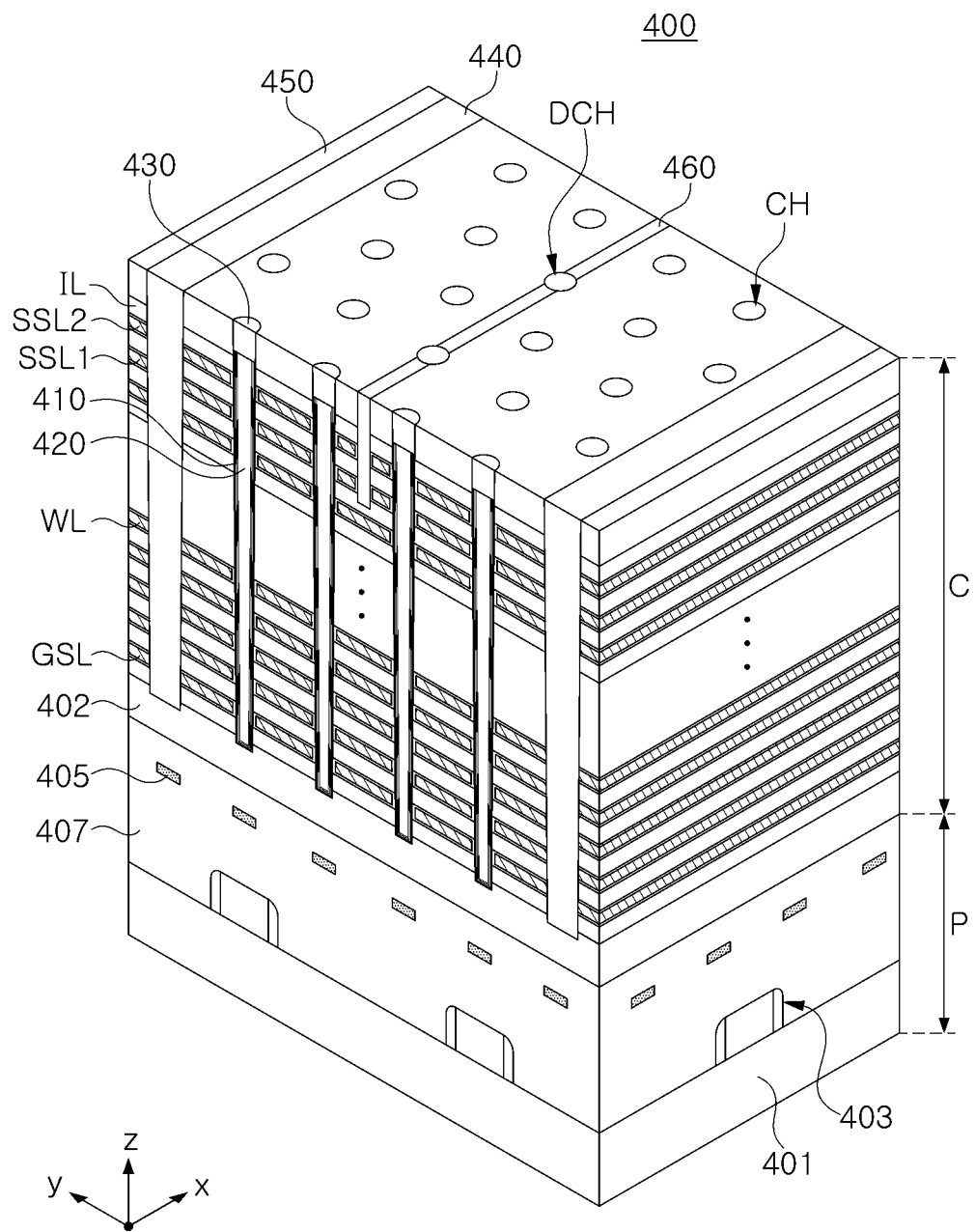
FIG. 7 is a perspective view illustrating in one example a three-dimensional (3D) memory device according to embodiments of the inventive concept.

FIG. 7 is a perspective drawing illustrating one possible configuration for a three-dimensional (3D) memory device 400 according to embodiments of the inventive concept.

Referring to FIG. 7, the memory device 400 incudes a cell region C disposed above a peripheral circuit region P. The peripheral circuit region P may be disposed below the cell region C and may include peripheral circuits such as a page buffer circuit, a decoder circuit, etc. The cell region C may include a memory cell array. The peripheral circuit region P may include a first substrate 401, and the cell region C may include a second substrate 402, different from the first substrate 401.

For example, the peripheral circuit region P may include a plurality of peripheral circuit elements 403 provided on the first substrate 401, a plurality of interconnection lines 405 connected to the peripheral circuit elements 403, and a first interlayer dielectric 407 covering the peripheral circuit elements 403 and the interconnection lines 405. The peripheral circuit elements 403, included in the peripheral circuit region P, may provide circuits required to drive the memory device 400, for example, a page buffer circuit, a decoder circuit, a power generator, and the like.

The second substrate 402, included in the cell region C, may be disposed above the first interlayer dielectric 407. The cell region C may include a ground select line GSL, wordlines WL, string select lines SSL1 and SSL2, and a plurality of insulating layers IL stacked on the second substrate 402. Insulating layers IL may be alternately stacked with the ground select line GSL, the wordlines WL, and the string select lines SSL1 and SSL2. The number of the ground select line GSL and the string select lines SSL1 and SSL2 is not limited to that illustrated in FIG. 7 and may be changed.

The cell region C may include channel structures CH extending in a first direction (a Z-axis direction) perpendicular to an upper surface of the second substrate 402. The channel structures CH may be connected to the second substrate 402 through the ground select line GSL, the wordlines WL, and the string selection lines SSL1 and SSL2. The channel structures CH may include a channel region 410, a buried insulating layer 420 filling an internal space of the channel region 410, a bitline connection layer 430, and the like. Each of the channel structures CH may be connected to at least one bitline through the bitline connection layer 430. For example, the ground select line GSL, the wordlines WL, the string select lines SSL1 and SSL2, the insulating layers IL, and the channel structures CH may be defined as a stacked structure.

At least one gate insulating layer may be disposed on an external side of the channel region 410. In an embodiment, a gate insulating layer may include a tunneling layer, a charge storage layer, a blocking layer, and the like, sequentially disposed from the channel region 410. According to an embodiment, at least one of the tunneling layer, the charge storage layer, and the blocking layer may be formed to surround the ground select line GSL, the wordlines WL, and the string select lines SSL1 and SSL2.

The ground select line GSL, the wordlines WL, and the string select lines SSL1 and SSL2 may be covered with the interlayer dielectric 450. In addition, the ground select line GSL, the wordlines WL, and the string select lines SSL1 and SSL2 may be divided into a plurality of regions by wordline cuts 440. In an embodiment, the string select lines SSL1 and SSL2 may be divided by an isolation insulating layer 460 into a plurality of regions between a pair of wordline cuts 440 adjacent to each other in a second direction (a Y-axis direction) parallel to an surface of the second substrate 402.

In an embodiment, dummy channel structures DCH may be provided in a region in which the isolation insulating layer 460 is disposed. The dummy channel structures DCH may be the same as the channel structures CH, but may not be connected to a bitline.

According to certain embodiments, to address process difficulties caused by an increase in the number of wordlines WL, a portion of the wordlines WL may be stacked and a lower channel structure may be formed, and then, the remainder of the wordlines WL may be stacked and an upper channel structures may be formed. In this case, each of the channel structures CH may include a lower channel structure and an upper channel structure isolated from each other in the first direction.

Characteristics of a memory cell may be degraded in a region adjacent to a boundary on which the upper channel structure and the lower channel structure are connected to each other. Therefore, a dummy wordline may be disposed in the region adjacent to the boundary. The dummy wordline may be connected to a dummy memory cell, and valid data may not be stored in the dummy memory cell.

Figure 8:
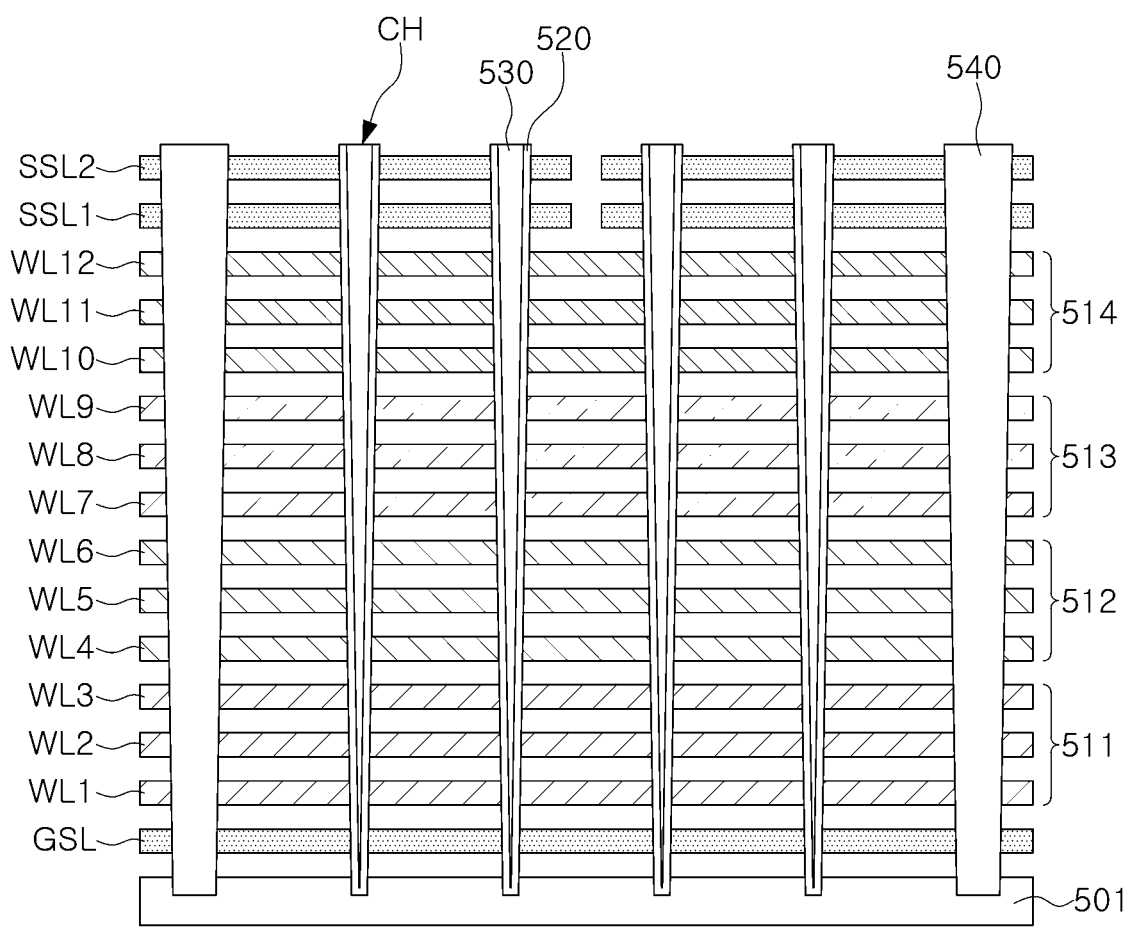
FIGS. 8 and 9 are respective cross-sectional views further illustrating possible methods of operating the 3D a memory device of FIG. 7.
Figure 9:
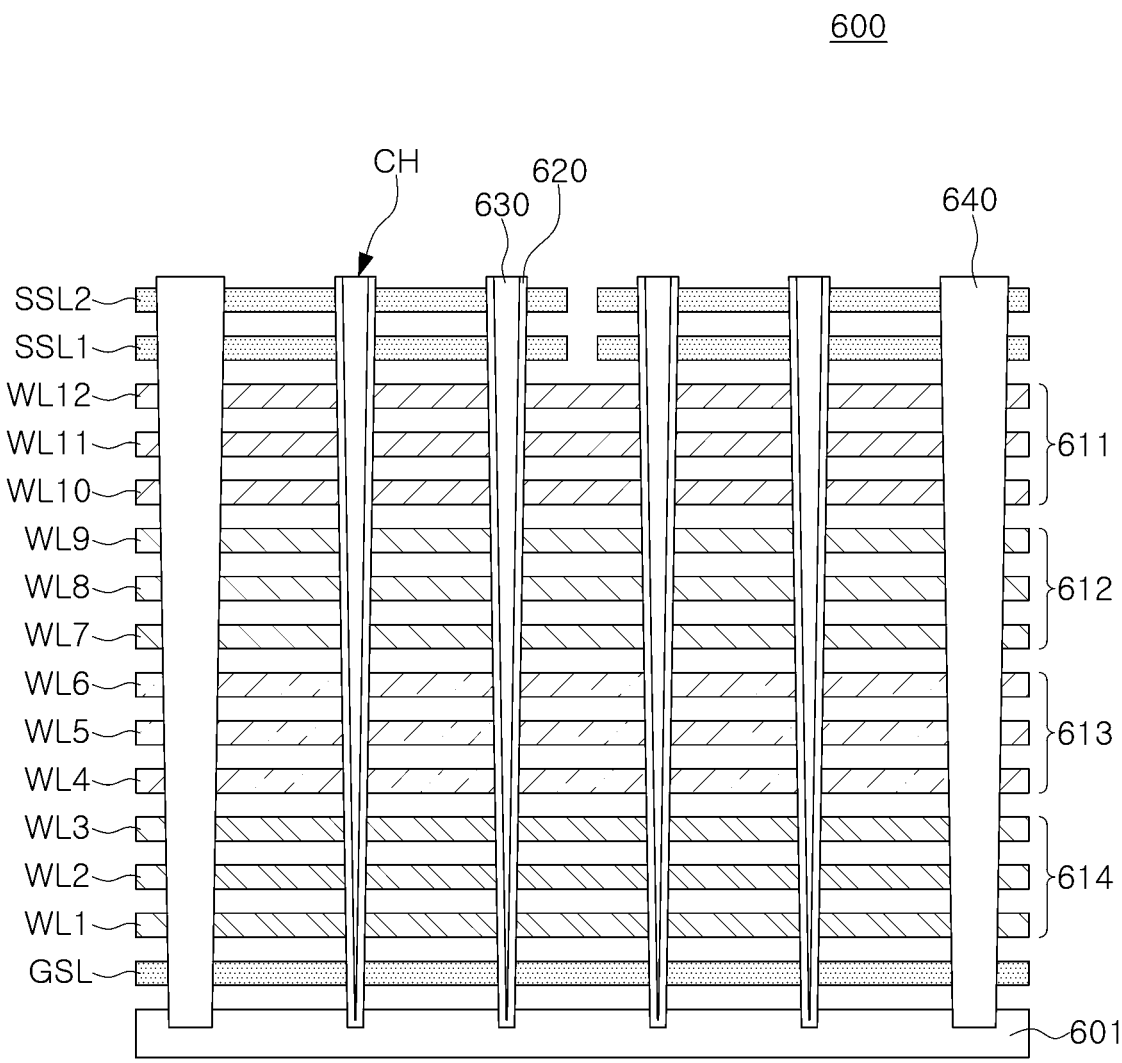

FIGS. 8 and 9 are respective cross-sectional diagrams further illustrating a method of operating 3D memory devices according to embodiments of the inventive concept.

In FIGS. 8 and 9, a number of data bits stored in each memory cell may vary depending on the location of memory cells in relation to the wordlines WL1 to WL12. And a read operation selected from a group of available read operations may be performed by a controller to variably read data depending on memory cell location in relation to the wordlines WL1 to WL12.

Referring to FIGS. 8 and 9, memory devices 500 and 600 may include substrates 501 and 601 and ground select lines GSL stacked in a direction perpendicular to upper surfaces of the substrates 501 and 601, wordlines WL1 to WL12, string select lines SSL1 and SSL2, and channel structures CH extending in a direction perpendicular to the upper surface of the substrate 501, respectively. Each of the channel structures CH may include channel regions 520 and 620 and buried insulating layers 530 and 630. A gate insulating layer, including at least a portion of a tunneling layer, a charge storage layer, and a blocking layer, may be disposed on an external side of each of the channel regions 520 and 620.

The ground select line GSL, the wordlines WL1 to WL12, and the string select lines SSL1 and SSL2 may be divided into a plurality of regions by the wordline cuts 540 and 640. Each of the string select lines SSL1 to SSL2 may be divided into two or more regions between a pair of wordline cuts 540 and 640 adjacent to each other.

In the embodiment illustrated in FIG. 8, 1-bit data may be stored in each of the memory cells connected to a first group 511 of wordlines WL1 to WL3 and 2-bit data may be stored in each of the memory cells connected to a second group 512 of wordlines WL4 to WL6. In addition, 3-bit data may be stored in each of the memory cells connected to a third group 513 of wordlines WL7 to WL9, and 4-bit data may be stored in each of the memory cells connected to a fourth group 514 of wordlines WL10 to WL12.

In one embodiment, each of the channel structures CH and the wordline cuts 540 may have a tapered shape having a width decreased in a direction toward the substrate 501. Accordingly, the first group of wordlines WL1 to WL3, relatively close to the substrate 501, may have a relatively larger area and relatively lower resistance than the fourth group of wordlines WL10 to WL12 relatively distant from the substrate 501. As a result, resistance characteristics of the memory cells connected to the first group of wordlines WL1 to WL3 may be superior to resistance characteristics of the memory cells connected to the fourth group of wordlines WL10 to WL12.

In an embodiment, data having a relatively high FOU may be stored in memory cells connected to the first group of wordlines WL1 to WL3 (i.e., the memory cells may be operated as SLC), and data may be read from the memory cells connected to the first group of wordlines WL1 to WL3 using a read operation having relatively high speed (e.g., a voltage sensing operation). Accordingly, the speed of access to data having a high FOU may be increased to improve performance of the memory device 500.

In an embodiment illustrated in FIG. 9, 4-bit data may be stored in memory cells connected to the first group 614 of wordlines WL1 to WL3, 3-bit data may be stored in memory cells connected to the second group 613 of wordlines WL4 to WL6. In addition, 2-bit data may be stored in memory cells connected to the third group 612 of wordlines WL7 to WL9, and single bit data may be stored memory cells connected to the fourth group 611 of wordlines WL10 to WL12.

Similarly to the embodiment illustrated in FIG. 8, each of the channel structures CH and the wordline cuts 540 may have a tapered shape having a width decreased in a direction toward the substrate 601. However, in FIG. 9, single bit data may be stored in memory cells connected to the fourth group of wordlines WL10 to WL12, each having relatively high resistances, and a voltage sensing operation having high reading speed may be applied.

In addition, 4-bit data may be stored in memory cells connected to the first group 614 of wordlines WL1 to WL3, each having relatively low resistance, and a current sensing operation having low reading speed but high accuracy may be applied. In other words, in the embodiment illustrated in FIG. 9, reliability of the memory device 600 may be improved by storing 4-bit data in memory cells connected to the first group 614 of wordlines WL1 to WL3 and applying a current sensing operation having high accuracy to memory cells connected to the first group 614 of wordlines WL1 to WL3. In addition, in the embodiment illustrated in FIG. 9, a decrease in read operation speed caused by use of the current sensing operation may be significantly reduced by storing four bits of data in the memory cells connected to the first group 614 of wordlines WL1 to WL3 having improved resistance characteristics.

Figure 10:
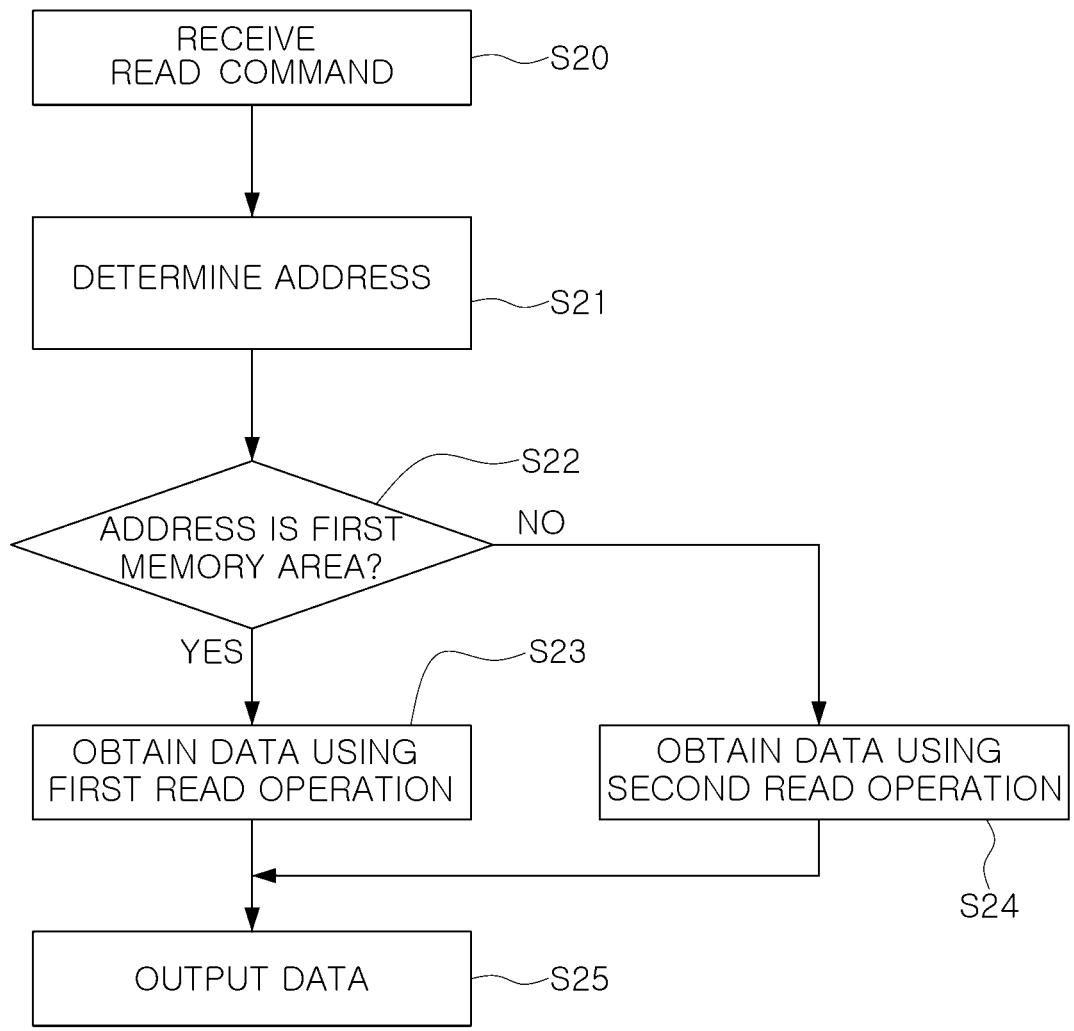
FIG. 10 is another flowchart summarizing in another example a method of operating a memory device according to an embodiment of the inventive concept.

FIG. 10 is a flowchart summarizing in one example a method of operating a memory device according to embodiments of the inventive concept.

Referring to FIG. 10, the method of operating a memory device according to an embodiment of the inventive concept begins when the memory device receives a read command (S20). The memory device may receive the read command from an external device, such as a host connected to of incorporating the memory device.

A controller of the memory device may be used to determine an address included in the read command or otherwise provided (S21). The controller may also be used to determine whether the address is located in the first memory area of the memory device (S22), where the first memory area is assumed to be an area in which the memory cells are used as SLC, as compared with a second memory area in which the memory cells are used as MLC.

If the address is determined to be the first memory area (S22=YES), the controller may read the data using a first read operation (S23), else if the address is determined to not be the first memory area (S22=NO), the controller may read the data using a second read operation, different from the first read operation (S24). And once the data is read, in may be output to the host (S25).

Here, the first read operation may be a voltage sensing operation. For example, the controller may control a first page buffer connected to the first memory area to read data from selected memory cell(s) among the memory cells of the first memory area.

As an example, the first page buffer may precharge a selected bitline connected to a selected memory cell during a first time, and the first page buffer may develop the selected bitline during a second time subsequent to the first time. The first page buffer may sense a voltage on a sensing node by connecting the sensing node, connected to at least one latch, to a selected bitline while developing the selected bitline to read data from the selected memory cell.

In contrast, the second read operation may involve the execution of a current sensing operation. For example, the controller may control a second page buffer connected to the second memory area to read data from selected memory cell(s) among memory cells of a memory area other than the first memory area (e.g., a second memory area).

The second page buffer may include a sensing node to which at least two latches are connected, and may precharge a selected bitline, connected to a selected memory cell, and the sensing node during a first time. During a second time subsequent to the first time, the second page buffer may detect a change in a voltage on the sensing node depending on current, flowing from the sensing node to the selected bitline, to read data from the selected memory cell. In an embodiment, the first page buffer reading data of the first memory area and the second page buffer reading data of the second memory area may have the same structure. Alternatively, the remainder of circuits may have the same structure except for the number of latches.

Figure 11:
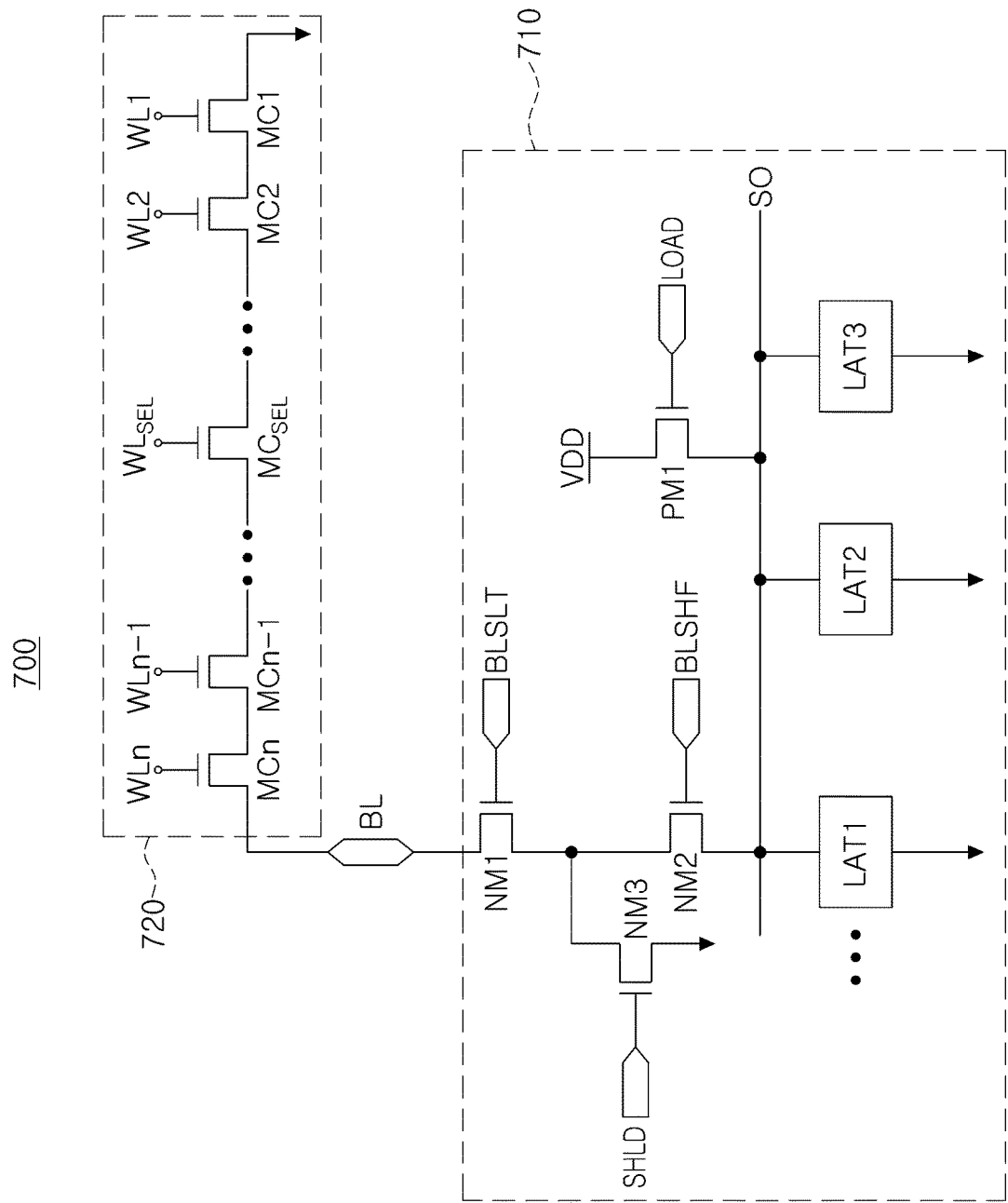
FIG. 11 is a circuit diagram illustrating in one example the execution of a read operation by a memory device according to an embodiment of the inventive concept.

FIG. 11 is a circuit diagram illustrating in one example a read operation that may be executed by a memory device according to an embodiment of the inventive concept.

In FIG. 11, a page buffer 710 may be included in a memory device 700. The page buffer 710 described with reference to FIG. 11 may be applied to both a voltage sensing operation, having relatively high reading speed, and a current sensing operation having low reading speed but providing an accurate read operation.

Referring to FIG. 11, the page buffer 710 may include a PMOS element PM1, first to third NMOS elements NM1 to NM3, and latches LAT1 to LAT3. The number of latches LAT1 to LAT3 may vary depending on embodiment, and the latches LAT1 to LAT3 may be connected to a sensing node SO.

The page buffer 710 may be connected to a memory cell string 720 through a bitline BL. The memory cell string 720 may be included in a memory area and may include memory cells MC1 to MCn connected to each other in series. Although not illustrated in FIG. 11, a string selection element and a ground selection element may be connected to both ends of the memory cells MC1 to MCn. The memory cells MC1 to MCn may be connected to wordlines WL1 to WLn. In certain embodiments, one bitline BL may be connected to two or more memory cell strings 720.

Hereinafter, certain read operations that may be used by a memory device according to embodiments of the inventive concept will be described with reference to FIGS. 12, 13, 14 and 15.

Figure 12:
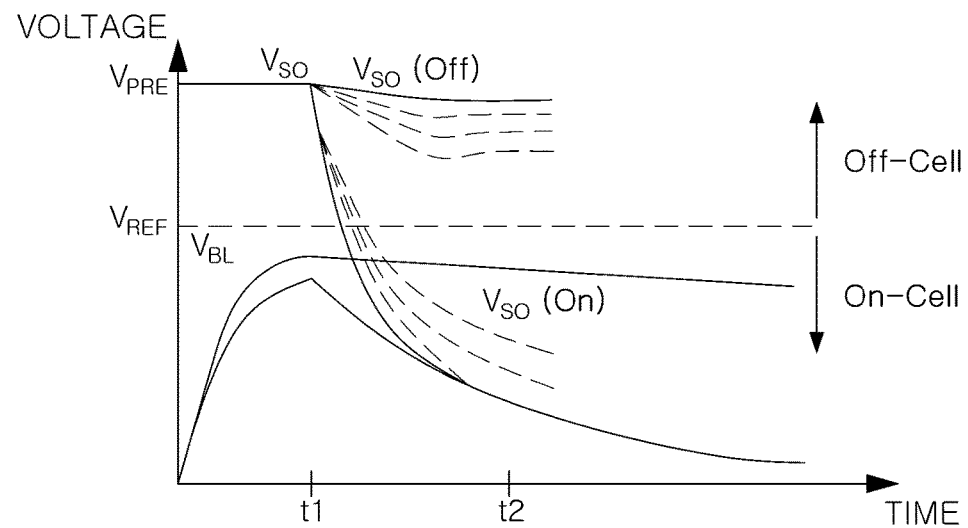
FIGS. 12 and 13 collectively illustrate the execution of a first read operation by a memory device according to an embodiment of the inventive concept.
Figure 13:
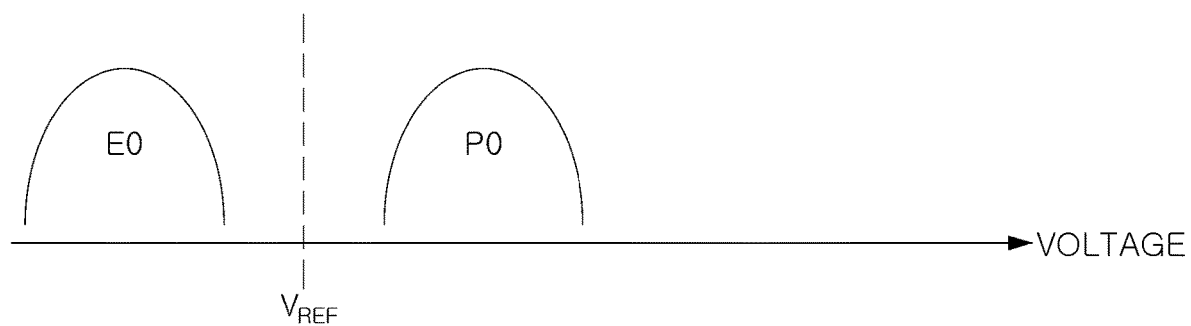

FIGS. 12 and 13 illustrate one possible first read operation that may be used by a memory device according to an embodiment of the inventive concept.

FIG. 12 is a graph illustrating a first read operation (e.g., a voltage sensing operation) that may be applied to a memory device according to an embodiment of the inventive concept. FIG. 13 is a graph illustrating a threshold voltage distribution for memory cell(s) being read by the first read operation. The memory cell(s) may have either an erased state E0 or a programmed state P0 depending on the programmed state of the memory cell(s).

Referring to FIG. 12, during a first period extending to time t1, a bitline BL may be precharged to increase a bitline voltage VBL. As an example, a PMOS element PM1 may be turned ON by a loading signal LOAD during the first time to input a power supply voltage VDD to the sensing node SO. Thus, a voltage on the sensing node SO may be increased to a precharge voltage VPRE. For example, the precharge voltage VPRE may be determined by the power supply voltage VDD and a threshold voltage of the PMOS element PM1.

In addition, a first NMOS element NM1 and the second NMOS element NM2 may be turned ON by a bitline select signal BLSLT and a control signal BLSHF during the first time. Accordingly, a precharging operation may be performed to increase a voltage on the bitline BL. A third NMOS element NM3 may be turned OFF by a holding signal SHLD during the first time.

At time t1 and extending to time t2, the PMOS element PM1 may be turned OFF by the loading signal LOAD. As the PMOS element PM1 is turned OFF, power supply to the sensing node SO and the bitline BL may be cut off and a development operation depending on a state of the memory cell string 720 may be performed. As an example, in a read operation, a reading voltage may be input to a selected wordline WLSEL and a pass voltage may be input to the remaining unselected wordlines. The reading voltage may be a voltage between the erased state E0 and the programmed state P0.

When a selected memory cell MCSEL has an erased state E0, a threshold voltage of the selected memory cell MCSEL may be lower than the reading voltage and the selected memory cell MCSEL may be defined as an ON-cell. Accordingly, due to the development operation performed for the second time, current may flow through the memory cell string 720 and a sensing node voltage VSO may be rapidly decreased, as illustrated in FIG. 12.

On the other hand, when the selected memory cell MCSEL has a programmed state P0, the threshold voltage of the selected memory cell MCSEL is higher than the reading voltage and the selected memory cell MCSEL may be defined as an OFF-cell. Accordingly, due to the development operation performed until time t2, little or no current flows through the memory cell string 720 and the sensing node voltage VSO may be slowly decreased, as illustrated in FIG. 12.

A controller of the memory device may compare the sensing node voltage VSO at a specific point in time (e.g., time t2) with a predetermined reference voltage VREF to read data from the selected memory cell MCSEL. In an embodiment, the controller of the memory device may read data during the development operation performed at the second time. For example, a speed of the read operation may be increased by comparing the sensing node voltage VSO and the reference voltage VREF during the development operation rather than after completion of the development operation.

The controller of the memory device may count the number of times of reading whenever reading data of the selected memory cell MCSEL. The controller may calculate a FOU for the stored data in the selected memory cell MCSEL using (e.g.,) the number of read times for the selected memory cell MCSEL and retention time, time elapsed since data was stored in the selected memory cell MCSEL, etc. In an embodiment, when the FOU is determined to be less than or equal to a FOU reference value, the data stored in the selected memory cell MCSEL may be transferred and stored to a MLC memory cell.

Figure 14:
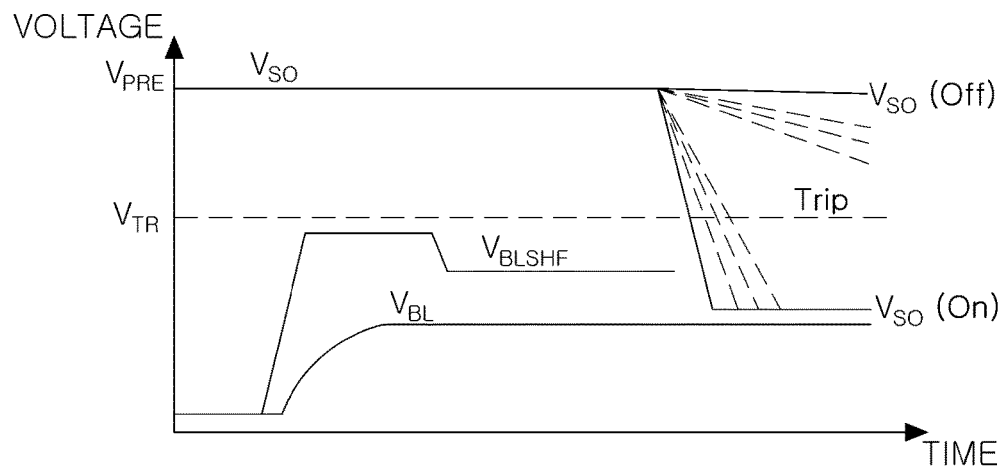
FIGS. 14 and 15 collectively illustrate the execution of a second read operation by a memory device according to an embodiment of the inventive concept.
Figure 15:
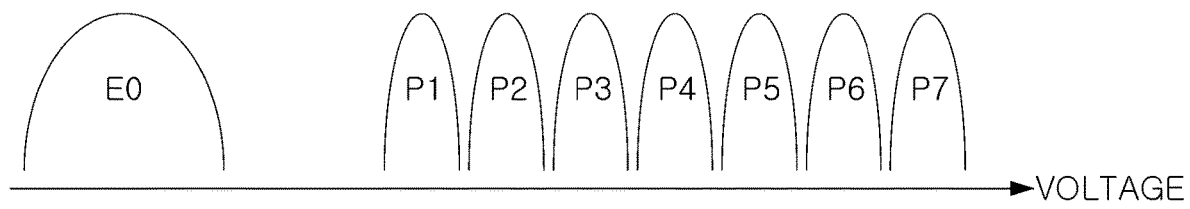

FIGS. 14 and 15 illustrate one possible second read operation that may be used by a memory device according to embodiments of the inventive concept.

FIG. 14 is a graph illustrating a second read operation (e.g., a current sensing operation) that may be applied to a memory device according to an embodiments of the inventive concept. FIG. 15 is a graph illustrating a threshold voltage distribution for a memory cell being read by the second read operation. The memory cell may have either one of an erased state E0 and programmed states P1 to P7 depending on whether the memory cell is programmed In the embodiment illustrated in FIG. 15, it is assumed that the memory cell operates as a 3-bit MLC (for example, TLC (triple level memory cell)). Alternately, the memory cell may be operated as a 4-bit MLC (for example, QLC (quad level memory cell)).

Referring to FIG. 14, voltages on a sensing node SO and a bitline BL may be increased by a page buffer. A PMOS element PM1 may be turned ON by a loading signal LOAD to input a power supply voltage VDD to the sensing node SO. Thus, a sensing node voltage VSO may be increased to a precharge voltage VPRE. For example, the precharge voltage VPRE may be determined by the power supply voltage VDD and a threshold voltage of the PMOS element PM1.

Then, a first NMOS element NM1 and a second NMOS element NM2 may be turned ON and a bitline voltage VBL may be increased by a bitline selection signal BLSLT and a control signal BLSHF. While the operations are performed, a third NMOS element NM3 may be turned OFF by a holding signal SHLD.

When a precharging operation on the bitline voltage VBL is completed, the PMOS element PM1 may be turned OFF by a loading signal LOAD. When the PMOS element PM1 is turned OFF, the sensing node voltage VSO may be changed depending on current flowing through a memory cell string 720 connected to a bitline BL. As an example, in a read operation, a reading voltage may be input to a selected wordline WLSEL and a pass voltage may be input to the remaining unselected wordlines. The reading voltage may be a voltage between a pair of adjacent states among the erase state E0 and the programmed states P1 to P7.

When the threshold voltage of the selected memory cell MCSEL is lower than the reading voltage, for example, when the selected memory cell MCSEL is an ON-cell, current flowing from the sensing node SO to a memory cell string 720 connected to the bitline BL may be relatively high. Accordingly, the sensing node voltage VSO may be rapidly decreased, as illustrated in FIG. 14.

In contrast, when the threshold voltage of the selected memory cell MCSEL is higher than the reading voltage, for example, when the selected memory cell MCSEL is an OFF-cell, the current flowing from the sensing node SO to a memory cell string 720 connected to the bitline BL may be relatively low. Accordingly, the sensing node voltage VSO may be hardly decreased or may be slowly decreased, as illustrated in FIG. 14. The page buffer 710 may compare the sensing node voltage VSO with a trip voltage VTR after completion of development to read data from the selected memory cell MCSEL As described above with reference to FIGS. 12 and 13, the controller of the memory device may count the number of read times for the selected memory cell MCSEL. The controller may calculate a FOU for the data stored in the selected memory cell MCSEL using (e.g.,) the number of read times for the selected memory cell MCSEL and retention time, time elapsed since the data was stored in the selected memory cell MCSEL, etc. When the FOU is greater than a FOU reference value, the data stored in the selected memory cell MCSEL may be transferred and stored to SLC memory cells. Alternatively, when the FOU is less than or equal to the FOU reference value, data stored in the selected memory cell MCSEL may be transferred and stored to a 4-bit MLC memory cell.

As described in relation to the embodiments described with reference to FIGS. 12, 13, 14 and 15, the first read operation may be a voltage sensing operation and the second read operation may be a current sensing operation. However, these are merely exemplary and the inventive concept is not limited thereto. For example, current sensing operation(s) may be used for both the first read operation and the second read operation, or voltage sensing operation(s) may be used in both the first read operation and the second read operation. Alternatively, the current sensing operation may be used as the first read operation and the voltage sensing operation may be used as the second read operation. As an example, when the voltage sensing operation is used as the second read operation, the sensing node voltage VSO may be compared with the reference voltage VREF after completion of development for the sensing node SO to improve accuracy of the read operation.

Figure 16:
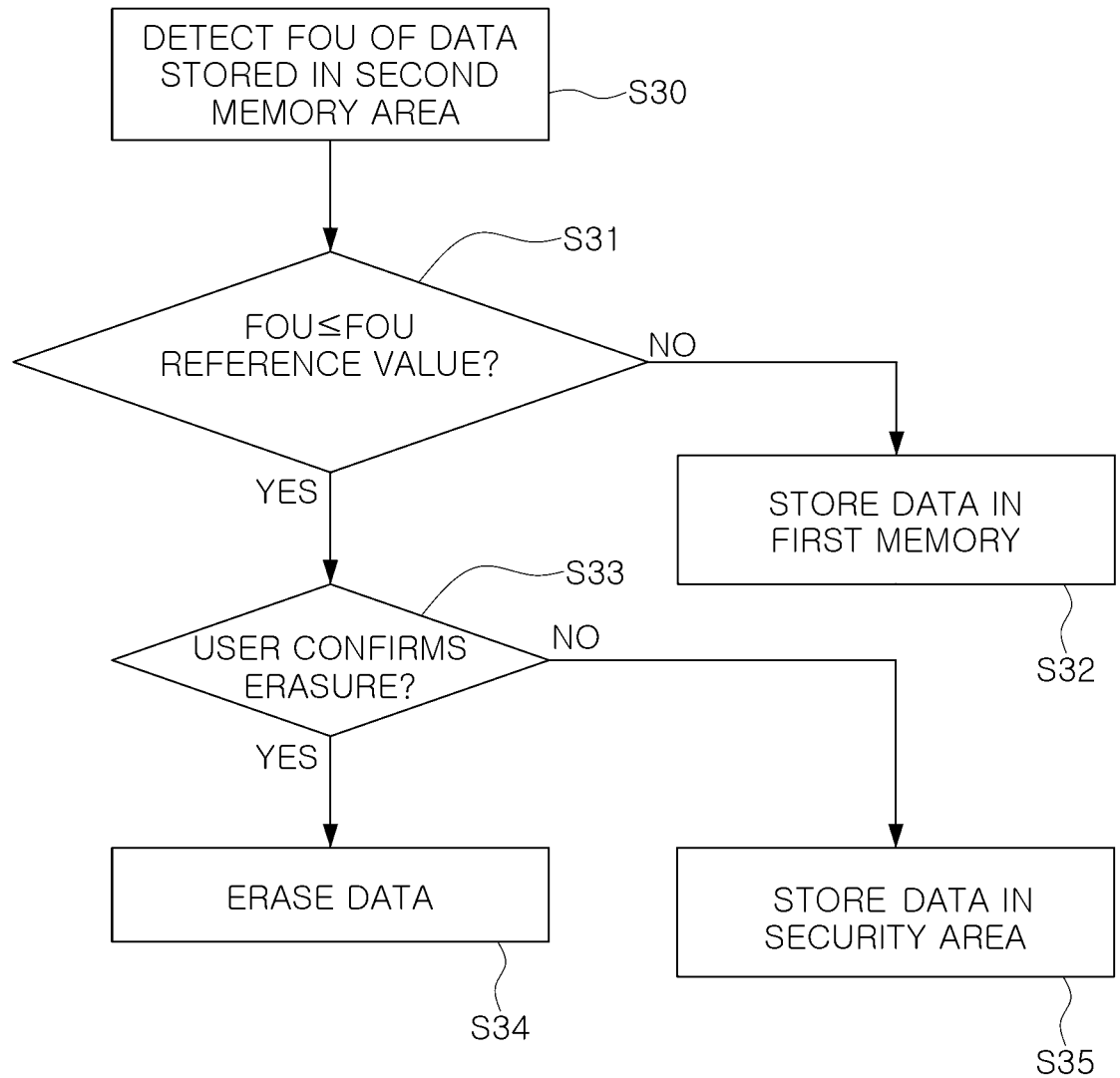
FIG. 16 is yet another flowchart summarizing in another example a method of operating a memory device according to an embodiment of the inventive concept.

FIG. 16 is a flowchart summarizing in one example a method of operating a memory device according to an embodiment of the inventive concept.

Referring to FIG. 16, the controller of the memory device may detect the FOU of data that has been stored in a second memory area (S30). Here, it is assumed that the second memory area is an area including MLC storing M-bit data, where 'M' is a positive integer.

Here again, the FOU of stored data may be determined using retention time, time elapsed since the data was stored in the second memory area, the number read operations executed in relation to the address of the stored data, etc. As an example, the FOU may be calculated by dividing the number of read operations executed in relation to the address of the stored data by the retention time.

Once the FOU of the stored data is detected, the controller of the memory device may compare the FOU with a predetermined FOU reference value and determine whether the FOU is less than or equal to the reference value (S31). If the FOU is not less than or equal to the FOU reference value (S31=NO), the data is stored in the first memory area (S32), where the first memory area is an area in which memory cell stores N-bit data, where 'N' may be a positive integer less than M. For example, the memory cells of the second memory area may be MLC and the memory cells of the first memory area may SLC or MLC storing fewer bits than the MLC of the second area. Accordingly, the number of memory cells in which data is stored in the first memory area may be greater than the number of memory cells in which data is stored in the second memory area.

However, if the FOU is determined to be less than or equal to the FOU reference value (S31=YES), the controller may confirm (e.g.,) to a user of a host device incorporating the memory device whether the data should be erased (S33). If the user confirms the erasure (S33=YES), the controller may erase the data (S34), else if the user does not confirm erasure (S33=NO), the controller stores the data in a security area (S35).

As noted above, the security area is an area in which no-erase data may be protected from normal operations (e.g., a normal erase operation). The security area may be part of the second memory area. Alternatively, the security area may be implemented in a memory area different from the first memory area and the second memory area. In an embodiment, the security area may be implemented in a memory area in which memory cells are high count MLC, like 4-bit, quad-level cells in order to efficiently manage storage space of the memory device.

In an embodiment, the memory device may designate data having a high importance weighting and also a very low FOU as security data. As the high importance weighting of the security data may indicate a critical future need for the data by a host device incorporating the memory device, the security data may be safely stored in the security area. In this regard, the weight assigned to the security data stored in the security area may be greater than a predetermined threshold value.

Figure 17:
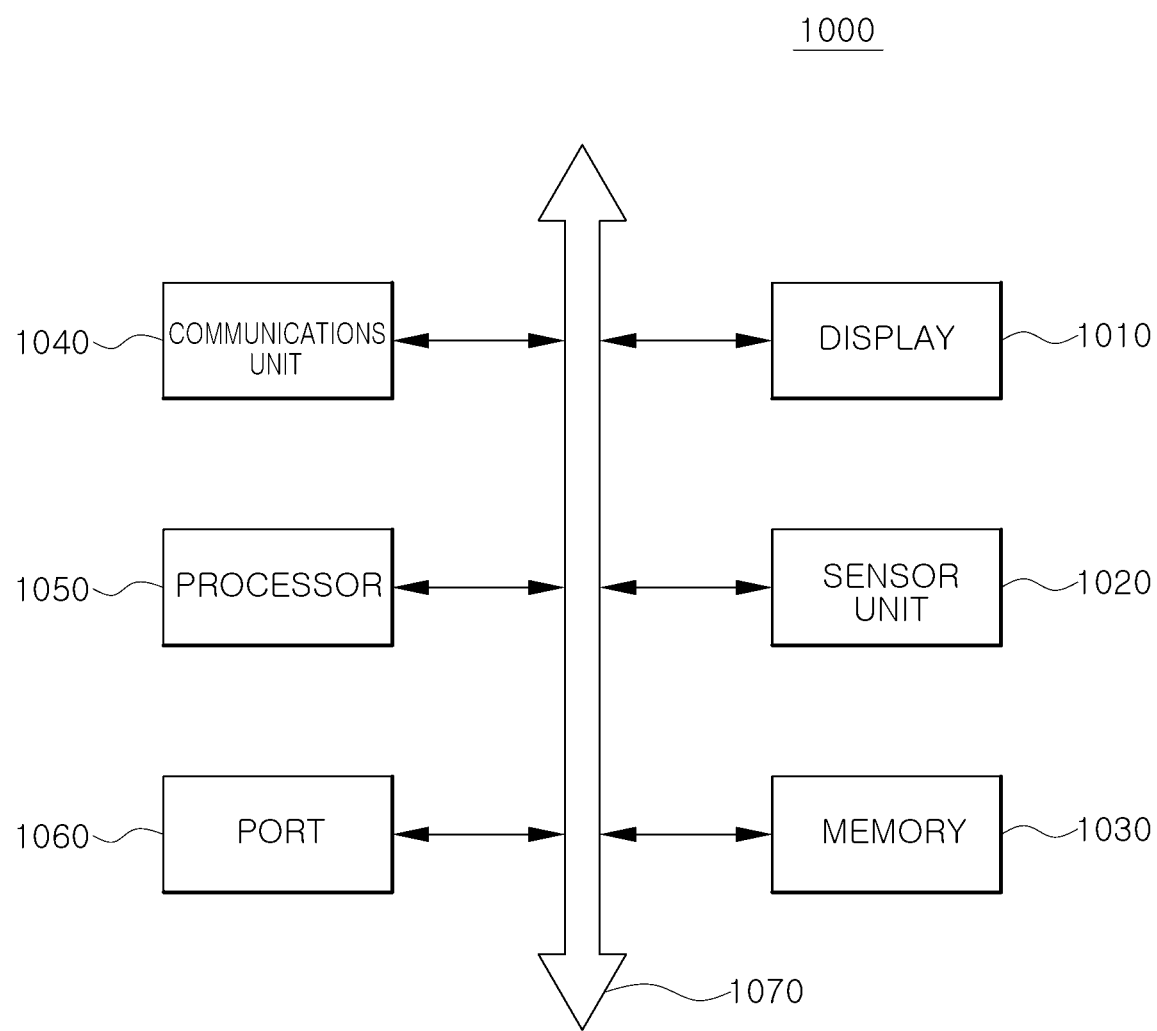
FIG. 17 is a general block diagram illustrating a computer system according to an embodiment of the inventive concept.

FIG. 17 is a block diagram of a computer system according to an embodiments of the inventive concept.

A computer system 1000 of FIG. 17 may include a display 1010, a sensor unit 1020, a memory 1030, a communications unit 1040, a processor 1050, a port 1060, and the like. The computer system 1000 may further include a power supply, an input/output (I/O) device, and the like. Among the components illustrated in FIG. 17, the port 1050 may be provided for the electronic device 1000 to communicate with a video card, a sound card, a memory card, a USB device, or the like. As an example, the computer system 1000 may be a neuromorphic computer system including the memory 1030, the processor 1050, and the like, and may include an artificial intelligence (AI) operation module.

The processor 1050 may include a neuromorphic circuit which mimics a shape of neurons in hardware, and may control overall operation of the computer system 1000. The processor 1050 may execute at least a portion of operations at different processing speeds, and the memory device 1030 may read data requested by the processor 1050 at different speeds according to the request of the processor 1050.

The memory 130 may include a plurality of memory devices, and each of the memory devices may be a semiconductor chip. A single memory device may have memory areas in which data are stored in different manners. In an embodiment, the memory controller included in the memory 1030 may data in the memory areas after weighting the data and dividing the weighted data.

As an example, a single memory device may include a first memory area, including a plurality of memory cells in which N-bit data is stored, and a second memory area including a plurality of memory cells in which M-bit data is stored, where 'M' and 'N' are positive integers and M may be greater than N. Each of the first memory area and the second memory area may be implemented in different memory planes, memory blocks, pages, etc.

The memory controller may store data having a high FOU in the first memory area and data having a low FOU in the second memory area depending on a FOU of stored data. The memory controller may read data, stored in the first memory area in a first read operation having high reading speed, and data stored in the second memory area in a second read operation having high accuracy. The first read operation may be a voltage sensing operation, and the second read operation may be a current sensing operation.

Accordingly, an optimized operation of the memory device 1030 may be implemented in response to the processor 1050 processing operations at different speeds to each other. In an embodiment, the memory 1030 may store data, required for an operation executed by the processor 1050 at high speed, in a first memory area and may read the stored data in a first read operation. In addition, the memory 1030 may store data, required for an operation executed by the processor 1050 at relatively slow speed, in a second memory area and may read the stored data in a second read operation.

Figure 18:
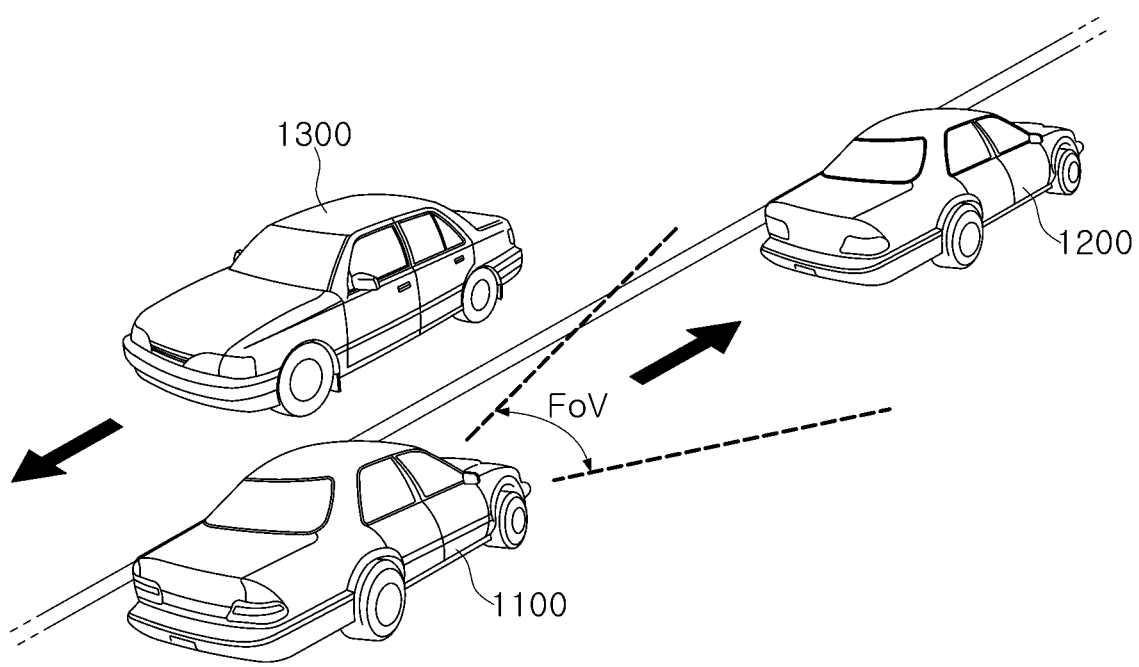
FIGS. 18 and 19 respectively illustrate operation of an autonomous driving vehicle including a memory device according to an embodiment of the inventive concept.
Figure 19:
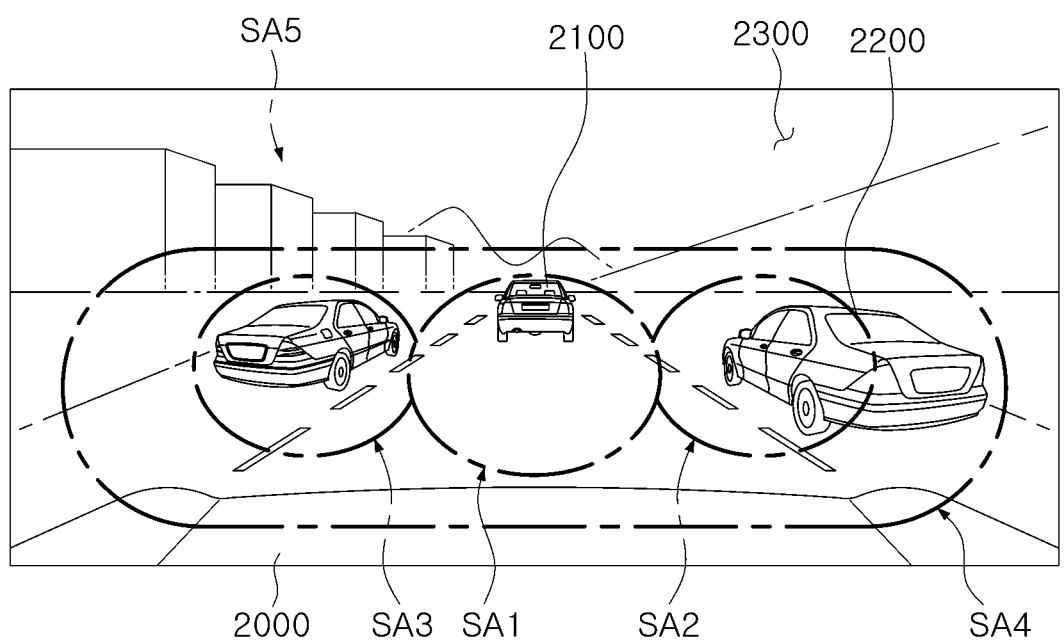

FIGS. 18 and 19 generally illustrate an autonomous driving vehicle including a memory device according to embodiments of the inventive concept.

Referring to FIG. 18, an autonomous driving vehicle according to an embodiment may be mounted on a vehicle to implement an autonomous driving vehicle 1100. The autonomous driving vehicle, mounted on the autonomous vehicle 1100, may include various sensors configured to collect situation information of the surroundings. As an example, the autonomous driving vehicle 1100 may detect the movement of a preceding vehicle 1200, which is driving in front, through an image sensor and/or an event sensor mounted on a front of the autonomous driving vehicle 1100. The autonomous driving vehicle 1100 may further include sensors configured to sense not only the front of the autonomous vehicle 1100 but also another vehicle 1300 which is driving in a front lane, a pedestrian around the autonomous vehicle 1100, and the like.

Among the sensors configured to collecting situation information around the autonomous driving vehicle 1100, at least one sensor may have a predetermined field of view (FoV), as illustrated in FIG. 18. As an example, when a sensor mounted on the front of the autonomous driving vehicle 1100 has a FoV as illustrated FIG. 18, information detected in a center of the sensor may be relatively frequently used by the autonomous driving vehicle 1100. This may be because most information, corresponding to the movement of the preceding vehicle 1200, is included in the information detected in the center of the sensor and events occur relatively frequently.

The autonomous driving vehicle device 1100 may process information, collected by the sensors of the autonomous vehicle 1100, in real time to control the movement thereof, and may store at least a portion of the information, collected by the sensors, in a memory device. Thus, data expected to have a relatively high FOU in the operation of the autonomous driving vehicle 1100 may be stored in a memory area in which data may be quickly read from the memory device.

A memory device, included in an autonomous driving vehicle, includes a first memory area including a plurality of memory cells in which N bits of data are stored, and a second memory including a plurality of memory cells M or more bits data are stored, where M and N are positive integers and M may be greater than N. Each of the first and second memory areas may be implemented in different memory planes, memory blocks, pages, and the like.

The memory controller may store data, expected to have a high FOU in the first memory area, and data expected to have a low FOU in the second memory area. The memory controller may read data, stored in the first memory area in a first read operation having high reading speed, and data stored in the second memory area in a second read operation having high accuracy. The first read operation may be a voltage sensing operation, and the second read operation may be a current sensing operation.

Referring to FIG. 19, a sensor may be mounted on an autonomous driving vehicle 2000 as a component of the autonomous driving vehicle 200 to collect information around the autonomous vehicle 2000. The sensor may collect information in a predetermined sensing area, and the sensing area may include first to fifth sensing areas SA1 to SA5. However, this is merely exemplary, and the sensing area of the sensor may be divided into more sensing areas or less sensing areas. In addition, the arrangement of the sensing areas may be modified to be different than is depicted in FIG. 19.

The sensor may include an image sensor and/or an event sensor, and information collected by the sensor may be transmitted to the memory device mounted in the autonomous driving vehicle 2000 as sensing data. The memory device may weight the sensing data and store the weighted sensing data in one of the memory areas depending on locations of sensing areas SA1 to SA5 in which information corresponding to the sensing data is collected, the type of information included in the sensing data, and the like.

Referring to FIG. 19, different types of information may be collected in the sensing areas SA1 to SA5 depending on the respective locations of the sensing areas SA1 to SA5 of the sensor. For example, first sensing data obtained by the sensor in the first sensing area SA1 may include information on the preceding vehicle 2100 driving ahead of the autonomous driving vehicle 2000 on which the autonomous vehicle is mounted. The first sensing data may include information of a distance from the preceding vehicle 2100. Alternatively, the first sensing data may include information required to determine the distance from the preceding vehicle 2100, for example, type and size of the preceding vehicle 2100.

Second sensing data, third sensing data, and fourth sensing data, respectively obtained in the second sensing area SA2, the third sensing area SA3, the fourth sensing area SA4 by the sensor, may include information corresponding to a surrounding vehicle 2200 driving around the autonomous driving vehicle 2000. In addition, information on a background 2300 may be maintained included in the fifth sensing area SA5.

Accordingly, it is predicated that the autonomous driving vehicle 2000 will use the first sensing data relatively more frequently and will use the fifth sensing data relatively less frequently. When the memory device mounted on the autonomous vehicle 2000 receives sensing data from the sensor, the memory controller may determine which area, among the first to fifth sensing areas SA1 to SA5, is a sensing area from which the sensing data is obtained. Accordingly, the sensing data may be distributed and stored in the memory areas.

For example, the first sensing data, obtained by sensing the preceding vehicle 2100 by the sensor, may be stored in the first memory area, and the fourth sensing data and/or the fifth sensing data may be stored in the second memory area. According to certain embodiments, the first sensing data and the second sensing data may be weighted. Each memory cell of the first memory area may store N bits of data, and each memory cell of the second memory area may store M bits of data, where M and N are positive integers and M may be greater than N. As described above, different reading manners may be applied to the first memory area and the second memory area.

As described above, according to an embodiment, a single memory chip may include a first memory region in which a single memory cell stores N bits of data, a second memory region in which a single memory cell stores M bits of data, where M is greater than N, and a controller. The controller may read data from the first memory area and data of the second memory area in different reading manner to each other. Data having a high FOU may be stored in the first memory area and data having a low FOU may be stored in the second memory area. Accordingly, a storage space of the memory device may be efficiently used and reliability and reading speed may be improved. In addition, a memory device optimized for a neuromorphic computer system and an autonomous driving vehicle may be provided.

While embodiments of the inventive concept have been shown and described above, it will be apparent to those skilled in the art that modifications and variations could be made without departing from the scope of the inventive concept as defined by the appended claims.

What is claimed is:

1. A memory device comprising:
a memory area including a first memory area including first memory cells storing N-bit data and a second memory area including second memory cells storing M-bit data, where 'M' and 'N' are natural numbers and M is greater than N; and
a controller configured to read data stored in the first memory area using a first read operation, read data stored in the second memory area using a second read operation different from the first read operation, and selectively store first data in one of the first memory area and the second memory area based on a frequency of use (FOU) of the first data,
the FOU of the first data stored in the first memory area is greater than the FOU of the first data stored in the second memory area,
wherein the controller is further configured to compare the FOU of the first data with a first FOU reference value and a second FOU reference value less than the first FOU reference value,
to store the first data in the first memory area upon determining that the FOU of the first data is greater than the first FOU reference value, and to store the first data in the second memory area upon determining that the FOU of the first data is less than or equal to the first FOU reference value and greater than the second FOU reference value, and
to store the data in a memory area other than the first memory area and the second memory area, upon determining that the FOU of the first data is less than or equal to the second FOU reference value.

2. The memory device of claim 1, wherein the controller is further configured to store the first data in the second memory area upon receipt of the first data in the memory device, periodically detect a current FOU of the stored first data, and to store the stored first data in the first memory area upon determining that the current FOU of the stored first data is not less than or equal to a FOU reference value.

3. The memory device of claim 1, wherein the memory area includes a first memory plane including the first memory area, and a second memory plane different from the first memory plane, the second memory plane including the second memory area.

4. The memory device of claim 1, wherein the memory area includes a first memory block including the first memory area, a second memory block including the second memory area, and
the first memory block and the second memory block are included in a single memory plane.

5. The memory device of claim 1, wherein the first memory cells are connected to a first group of wordlines and the second memory cells are connected to a second group of wordlines different from the first group of wordlines, and the first group of wordlines and the second group of wordlines are included in a single memory block.

6. The memory device of claim 5, wherein the first group of wordlines are disposed below the second group of wordlines in the single memory block.

7. The memory device of claim 1, wherein the first read operation is a voltage sensing operation, and during the voltage sensing operation, the controller is further configured to precharge a selected bitline connected to a selected memory cell among the first memory cells and to connect the selected memory cell with a sensing node while developing the selected bitline.

8. The memory device of claim 1,
wherein N=1 and M=2, and
the memory area further includes a third memory area including memory cells each storing 3-bit data and a fourth memory area including fourth memory cells storing 4-bit data.

9. The memory device of claim 8, wherein the controller is further configured to compare the FOU of the first data with a third FOU reference value,
to store the data in the third memory area, upon determining that the FOU of the first data is less than or equal to the second FOU reference value and greater than the third FOU reference value, and
to store the first data in the fourth memory area, upon determining that the FOU of the first data is less than or equal to the third FOU reference value.

10. The memory device of claim 9, wherein the controller is further configured to allow erasure of the first data stored in the fourth memory area only upon receiving a user confirmation.

11. The memory device of claim 10, wherein the controller is further configured to store the first data stored in the fourth memory area in a security area upon receiving the user confirmation when a weight assigned to the first data exceeds a threshold value.

12. The memory device of claim 1, wherein the memory area and the controller are commonly integrated on a single semiconductor chip.

13. A memory device comprising:
a memory area including a first memory area including first memory cells, another memory area including memory cells, and a security area; and
a controller configured to
read data stored in the first memory area using a first read operation,
read data stored in the another memory area using a second read operation different from the first read operation,
selectively store first data in one of the first memory area and the another memory area based on a frequency of use (FOU) of the first data and an importance weighting of the first data, and
store second data having a FOU lower than a predetermined reference value and a weight higher than a predetermined threshold value in the security area,
wherein each of the first memory cells stores 1-bit data, and each of the memory cells stores data of 2 or more bits.

14. The memory device of claim 13, wherein the another memory area includes a second memory area including memory cells storing 2-bit data, a third memory area including memory cells storing 3-bit data, and a fourth memory area including memory cells storing 4-bit data, and
the security area includes at least a portion of at least one of the third memory area and the fourth memory area.

15. The memory device of claim 13, wherein the first read operation is a voltage sensing operation and the second read operation is a current sensing operation.

16. The memory device of claim 13, wherein the first read operation reads data stored in the first memory area faster than the second read operation reads data stored in the another memory area.

17. A computer system comprising:
a processor configured to control execution of a first operation at a first speed, control execution of a second operation at a second speed different from the first speed, and provide data to a memory device,
wherein the memory device comprises
a memory area including a first memory area including memory cells operated as single level memory cells (SLC), and a second memory area including memory cells operated as at least one of multi level memory cells (MLC), triple level memory cells (TLC) and quad level memory cells (QLC); and
a controller configured to
read data stored in the first memory area using a first read operation in response to execution of the first operation,
read data stored in the second memory area using a second read operation different from the first read operation in response to execution of the second operation, and
store the data provided by the processor in the first memory area when a frequency of use (FOU) of the data is greater than a first FOU reference value, and store the data provided by the processor in the second memory area when the FOU of the data is less than or equal to the first FOU reference value and greater than a second FOU reference value,
wherein the controller stores the data in a memory area other than the first memory area and the second memory area, when the FOU of the data is less than or equal to the second FOU reference value.

* * * * *